United States Patent [19]

Saxena

[11] Patent Number: 6,110,278
[45] Date of Patent: Aug. 29, 2000

[54] METHODS FOR AND PRODUCTS OF GROWTH OF SINGLE-CRYSTAL ON ARRAYED NUCLEATION SITES (SCANS) DEFINED IN NUCLEATION UNFRIENDLY SUBSTRATES

[76] Inventor: Arjun N. Saxena, 4217 Pomona Ave., Palo Alto, Calif. 94306

[21] Appl. No.: 09/131,764

[22] Filed: Aug. 10, 1998

[51] Int. Cl.⁷ .......................... C30B 23/04; C30B 25/04
[52] U.S. Cl. ........................... 117/95; 117/96; 117/101; 117/913; 117/923; 117/935
[58] Field of Search ................... 117/101, 95, 96, 117/935, 913, 923

[56] References Cited

U.S. PATENT DOCUMENTS

| | | | |
|---|---|---|---|
| 4,686,758 | 8/1987 | Liu et al. | 437/34 |
| 5,113,072 | 5/1992 | Yamaguchi et al. | 250/309 |
| 5,472,508 | 12/1995 | Saxena | 118/723 E |
| 5,733,369 | 3/1998 | Yonehara et al. | 117/89 |

FOREIGN PATENT DOCUMENTS 89302983  3/1989  European Pat. Off. .

OTHER PUBLICATIONS

G.E. Moore, "Lithography and the Future of Moore's Law", Optical/Laser Microlithography VIII: Proceedings of the SPIE, 2440, Feb. 20, 1995, pp. 2–17.

M.L. Alles, "Thin–film SOI emerges", IEEE Spectrum, Jun. 1997, pp. 37–45.

A.N. Saxena, K. Ramkumar, S.K. Ghosh, and M.A. Bourgeois, "Technology and Reliability Issues of Multilevel Interconnects in Bipolar, BiCMOS and CMOS VLSIC/ULSIC", Pro. IEEE Bipolar/BiCMOS Circuits and Technology Meeting (BCTM), Minneapolis, MN, 1993, pp. 12–19.

*Primary Examiner*—Robert Kunemund
*Attorney, Agent, or Firm*—Fliesler, Dubb, Meyer & Lovejoy LLP; Gideon Gimlan

[57] ABSTRACT

A template for seeding growth of a desired single-crystal material (e.g., Si, GaAs) is created by passing through a monocrystalline channelizing mask, in a channelizing direction thereof, at least one of a nucleation-friendly species (e.g., Si, Ga) and a knock-off species (e.g., Ar, F) for respective implant of a nucleation-friendly species within or removal of a nucleation-unfriendly material (e.g., $SiO_2$) of a supplied substrate. The desired single-crystal material is then grown in epitaxial-like manner from the thus-formed seeding-template. In one embodiment, silicon ions are projected through a monocrystalline silicon mask of a selected crystal orientation ((100), or (111)) in its channelizing direction so as to implant the silicon ions in a silicon dioxide layer of a supplied substrate according to the selected crystal orientation of the channelizing mask. Monocrystalline silicon is then epitaxially grown on top of the silicon dioxide layer with the same crystal orientation. Three-dimensional integrated circuits (3D ULSIC's or UPIC's) may then be formed with this technique. The technique may be extended to many other fields of application that can benefit from economic formation of single-crystal materials, such as optics, opto-electronics, tribology, metallurgy, and so forth.

31 Claims, 13 Drawing Sheets

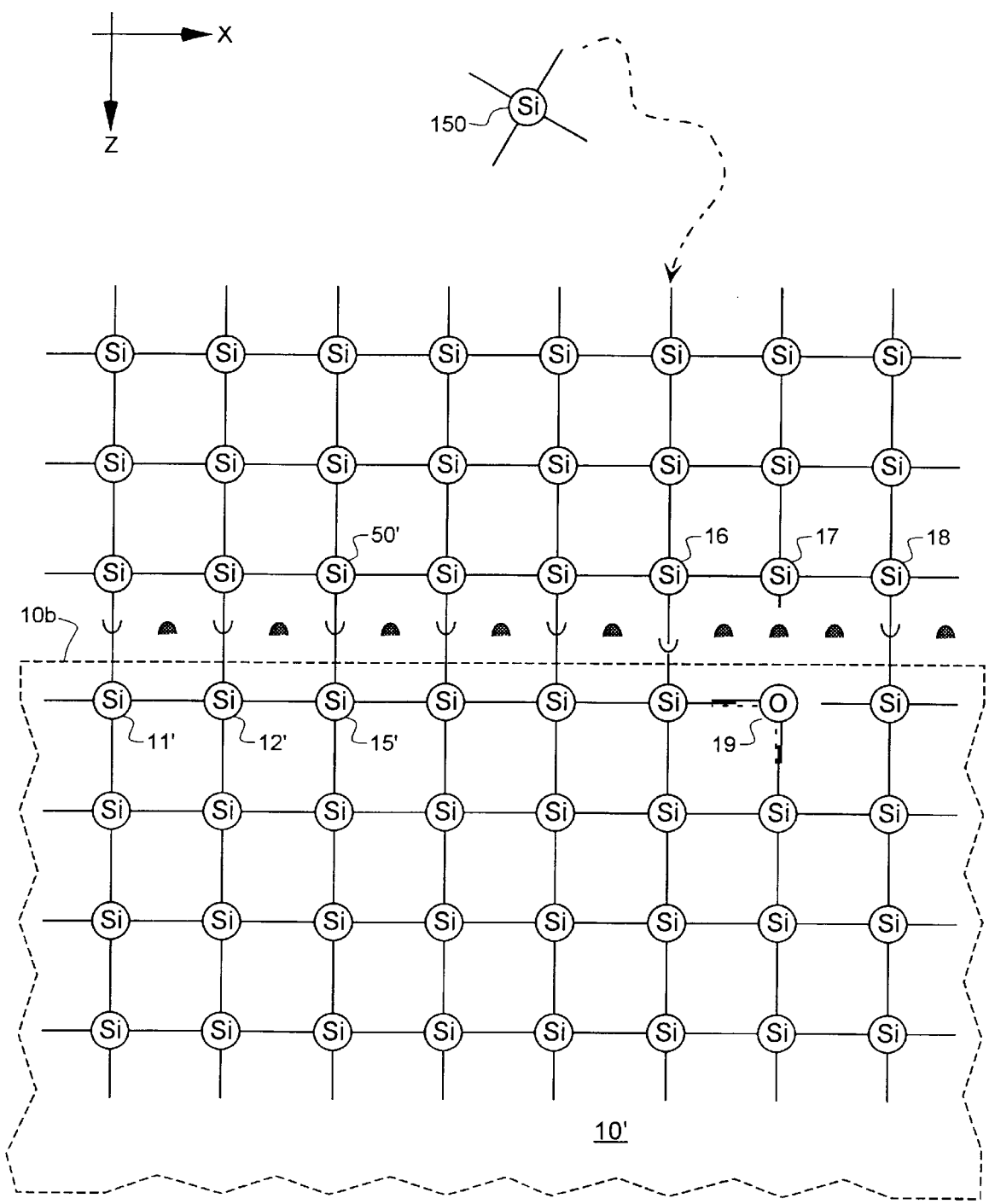

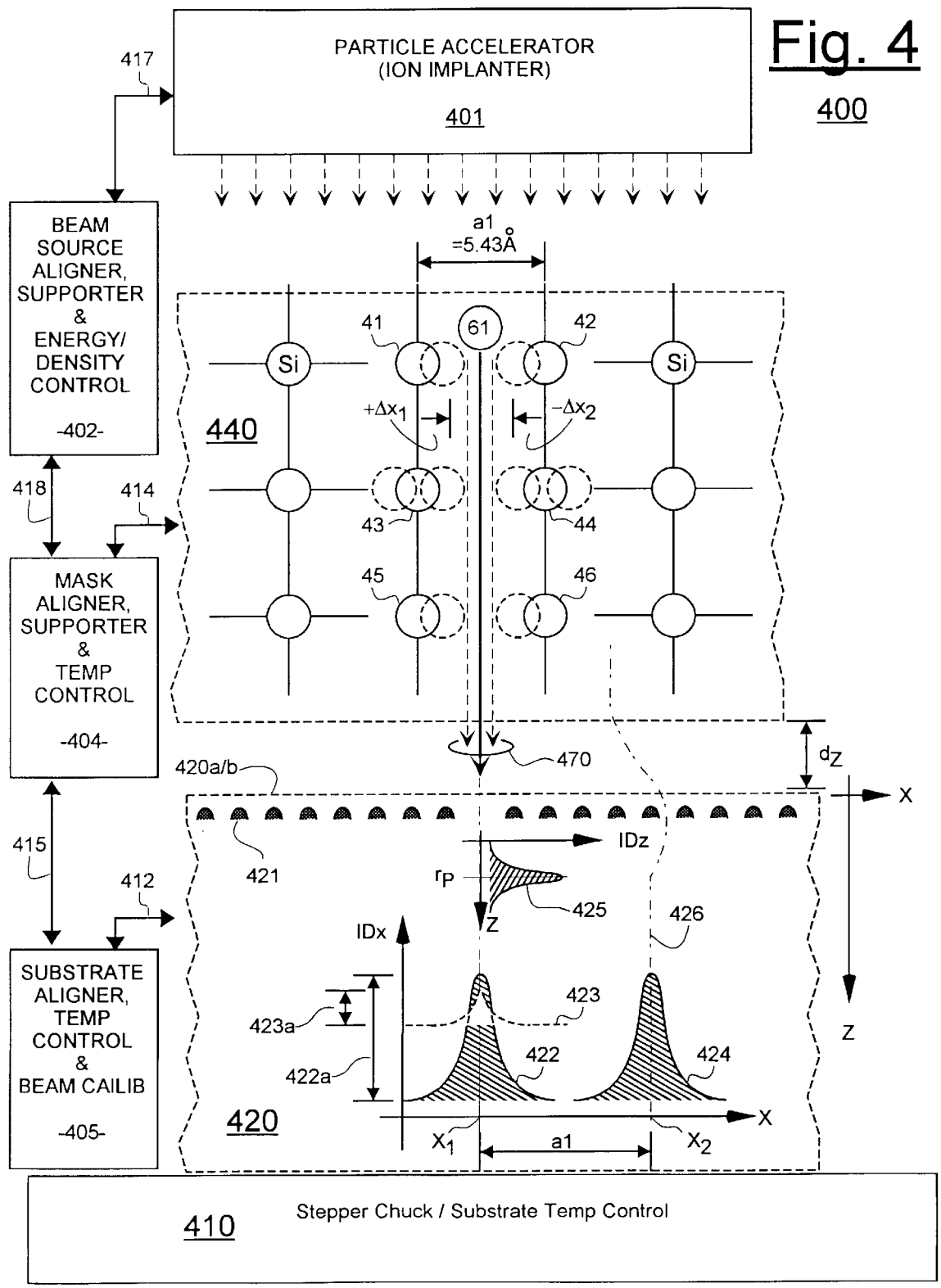

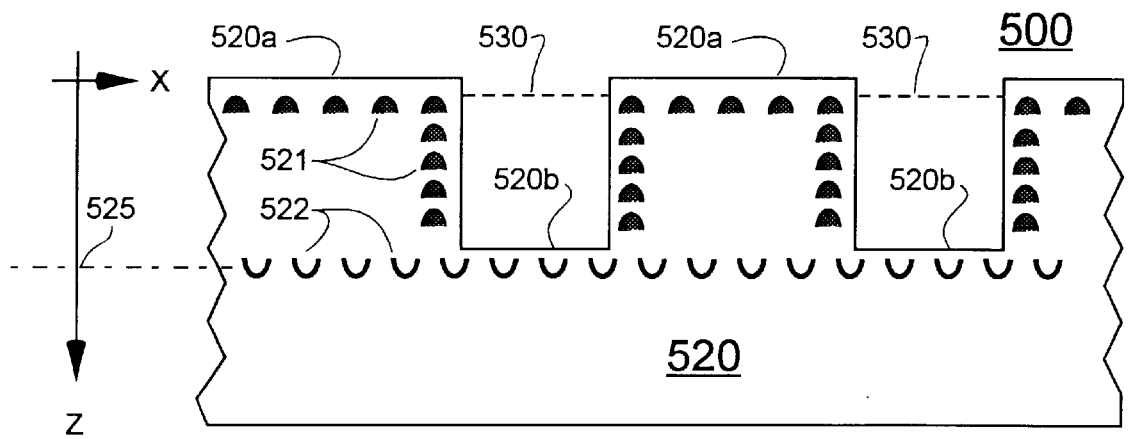
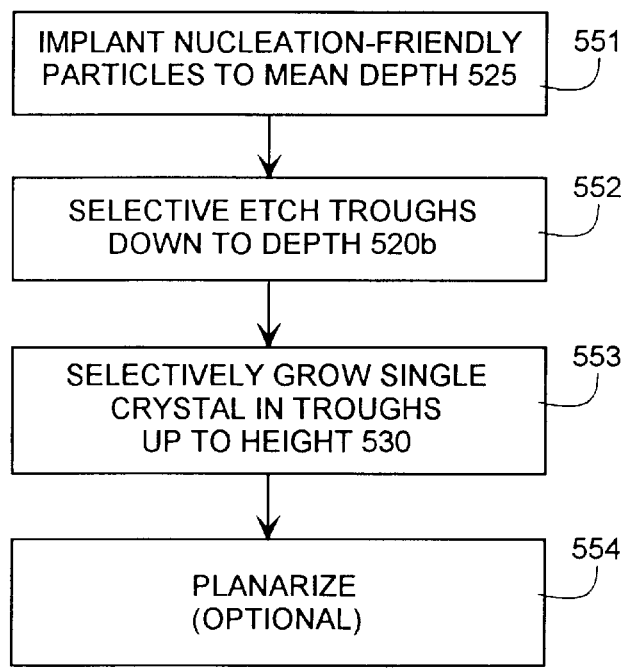

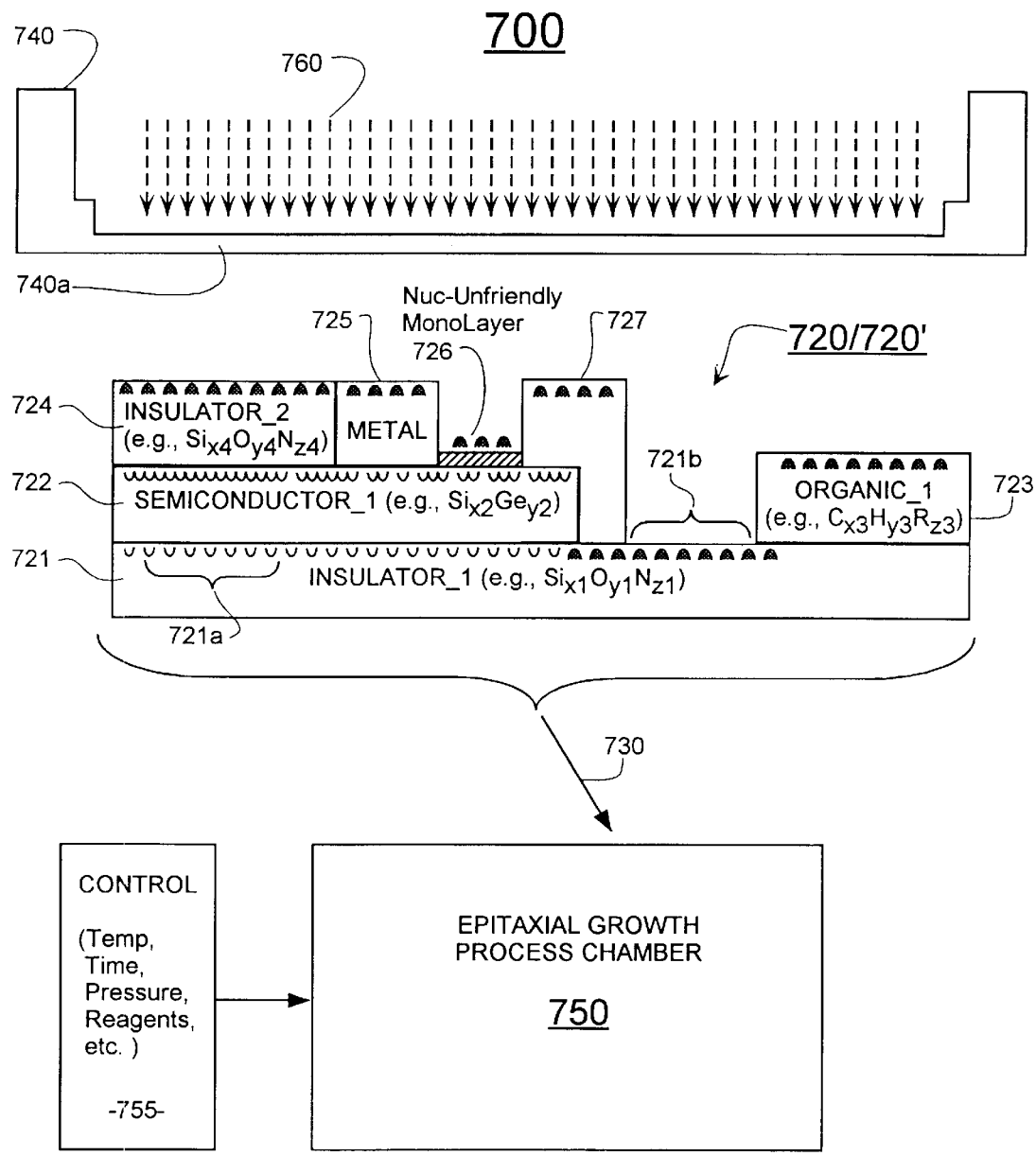

METHODS FOR AND PRODUCTS OF GROWTH OF SINGLE-CRYSTAL ON ARRAYED NUCLEATION SITES (SCANS) DEFINED IN NUCLEATION UNFRIENDLY SUBSTRATES

BACKGROUND

1. Field of the Invention

The invention is generally directed to the field of solid state materials. The invention is more specifically directed to new ways of growing single-crystal, solid state films on relatively arbitrary substrates that are nucleation-unfriendly.

2a. Cross Reference to Co-Related Applications

The following copending U.S. patent applications are fully owned by the owner of the present application, and their disclosures are incorporated herein by reference:

(A) Ser. No. 09/025,724 [Attorney Docket No. SAXN8000DIV1] filed Feb. 18, 1998 by inventor Arjun N. Saxena and originally entitled, ADVANCED TECHNIQUE TO GROW SINGLE CRYSTAL FILMS ON AMORPHOUS AND/OR NON-SINGLE CRYSTAL SURFACES; and (B) Ser. No. 08/140,723 [Attorney Docket No. SAXN8000] filed Oct. 21, 1993 by inventor Arjun N. Saxena and originally entitled, ADVANCED TECHNIQUE TO GROW SINGLE CRYSTAL FILMS ON AMORPHOUS AND/OR NON-SINGLE CRYSTAL SURFACES (which application is scheduled to issue as U.S. Pat. No. 5,792,270 on Aug. 11, 1998).

2b. Cross Reference to US Patents

The following U.S. patents are incorporated herein by reference:

(A) U.S. Pat. No. 5,472,508, issued Dec. 5, 1995 to Arjun N. Saxena, entitled APPARATUS FOR SELECTIVE CHEMICAL VAPOR DEPOSITION OF DIELECTRIC, SEMICONDUCTOR AND CONDUCTIVE FILMS ON SEMICONDUCTOR AND METALLIC SUBSTRATES; and (B) U.S. Pat. No. 4,686,758, issued Aug. 18, 1987 to M. S. Liu and B. Hoefflinger, entitled THREE-DIMENSIONAL CMOS USING SELECTIVE EPITAXIAL GROWTH.

2c. Cross Reference to Related Other Publications

The following publications are believed to be related to the present application and are cited here for purposes of reference:

(a) G. E. Moore, "Lithography and the Future of Moore's Law", Optical/Laser Microlithography VIII: Proceedings of the SPIE, 2440, Feb. 20, 1995, pp. 2–17;

(b) M. L. Alles, "Thin-film SOI emerges", IEEE Spectrum, June 1997, pp. 37–45;

(c) A. N. Saxena, K. Ramkumar, S. K. Ghosh, and M. A. Bourgeois, "Technology and Reliability Issues of Multilevel Interconnects in Bipolar, BiCMOS and CMOS VLSIC/ULSIC", Pro. IEEE Bipolar/BiCMOS Circuits and Technology Meeting (BCTM), Minneapolis, Minn., 1993, pp. 12–19; and (d) K. Yamagata, "Method for Forming Crystal Layers on a Substrate", European Patent Application No. 89302983.5, fled 23/03/89, published 02/11/89, Bulletin 89/44.

3. Background

Introduction

Characteristics of solid state materials can vary substantially depending on whether various atoms of a solid state composition are distributed in a highly ordered manner, or in a highly random manner or in some semi-ordered manner between these extremes.

The order-dependent characteristics of solid state materials can include one or more of the following: (a) electrical conductivity and other electrical properties (e.g., dielectric constant, charge mobility, etc.); (b) optical conductivity and other optical properties (e.g., refractive index, photon speed, etc.); (c) thermal conductivity and other thermal properties (e.g., coefficient of thermal expansion, etc.); (d) mechanical strength and other mechanical properties (e.g., stress/strain curves, etc.); and chemical properties (e.g., resistance to corrosion, reaction consistency, etc.).

If practical processes can be developed for creating tightly-knit combinations of highly ordered materials and of other materials whose atoms are organized in a more random fashion, new composites of solid state materials may be created that have useful combinations of complex characteristics. For example, it may be desirable to integrate optical single-crystal materials with semiconductor single-crystal materials so as to provide integrated monolithic devices with both kinds of functionalities (e.g., output and/or detection and/or processing of electrical signals as well as output and/or detection and/or processing of optical signals).

The term, 'single-crystal' (sc) or 'monocrystalline' (mono) is generally applied to a solid state article, layer or other entity whose atoms maintain a regular pattern of organization repeatedly and three-dimensionally over application-dictated linear distances. In most instances, these application-dictated linear distances cover at least 100 atoms, if not at least thousands or millions of atoms in at least one direction. For lithographically-defined devices having critical dimension of no smaller than about 0.1 $\mu$m, the application-dictated definition of single-crystal may be considered to cover 0.1 $\mu$m in at least one linear direction (typically laterally across an integrated circuit substrate). Examples of single-crystal materials include diamond, quartz, and monocrystalline silicon such as used in integrated circuits.

Traditionally, single-crystal materials are either found in nature or are manufactured by growth from a single-point 'seed'. Single-crystal materials may also be grown by way of homogeneous epitaxy atop a substrate made of the same single-crystal material. Single-crystal materials may be further grown by way of heterogeneous epitaxy atop a substrate made of a different single-crystal material that happens to have similar lattice constants (e.g., a GaAlAs layer grown on a GaAs monocrystalline substrate).

In the semiconductor industry, cylindrically-shaped silicon ingots are examples of seed-grown, monocrystalline silicon. These are typically sliced into disk shaped wafers. Often, a near-perfect, layer of single-crystal silicon is epitaxially grown on the original, monocrystalline wafer to serve as an active layer for electronic components (e.g., transistors). Plural integrated circuits are then lithographically defined on or in the active layer of each wafer, with one or more such circuits being placed in respective reticle areas. The wafer is then cut into individual dice and each die becomes a 'chip' that is sealed into a corresponding IC package.

The term 'amorphous' (am) is generally applied to solid state materials whose atoms are arranged in a highly chaotic or random manner. Examples of amorphous materials include non-crystalline, common glass (typically composed of amorphous silicon dioxide in combination with oxides of other materials such as boron, aluminum, sodium, zinc, etc.), and graphite or charcoal (amorphous carbon). Silicon may also be obtained in amorphous form.

It is possible to have crystal-like orderliness on a small atomic scale of, say, linear distances covering only a few hundred atoms while the same orderliness is not maintained over greater distances of say about 0.1 $\mu$m or greater. Materials having this type of mixed organization are often referred to as 'polycrystalline' (poly). Silicon may be obtained in a polycrystalline form, such as when Si is deposited by CVD process on amorphous $SiO_2$.

The usefulness of single-crystal (mono-crystalline) materials is well known. By way of example, monocrystalline silicon substrates are used extensively in the microelectronics industry as explained above. A major problem, however, is how to economically manufacture plural layers of monocrystalline silicon and how to combine these to other layers of different materials such as amorphous insulators. Although it well known how to produce a layer of polycrystalline Si on top of a layer of amorphous $SiO_2$ or amorphous $Si_3N_4$, the provision of single-crystal Si on top of amorphous $SiO_2$ or amorphous $Si_3N_4$ is a completely different matter. Heretofore, it was not known how to economically grow single-crystal materials on top of amorphous or other nucleation-unfriendly solids.

The Role of Single-Crystal Materials in the Semiconductor Industry

The current silicon-based, integrated circuit business has a total world market value in excess of $100 billion and continues to grow rapidly as new applications are created for computer chips and the like. Because of manufacturing limitations in the prior art, the 'active' part of most IC's is manufactured as a single, two-dimensional entity that is disposed across the planar surface of a single monocrystalline substrate. Mass production realities limit the size of each IC substrate to that of industry-standard dice and IC packages. (Each die is cut from a standard-sized wafer (e.g., one having a 300 mm diameter) after circuits are fabricated on the wafer. A typical die is about 20 mm by 30 mm or smaller.) The limited surface area that is available on each single-crystal, two-dimensional plane places a constraint on the number of active devices such as transistors, diodes, etc., that may be laid out on or in the substrate. Typically, the active monocrystalline layer is epitaxially grown on the monocrystalline surface of the wafer and later diced out. Each die has the same crystal orientation ((100), (111), etc.) as that of the bulk wafer.

In order to reproduce integrated circuit chips on a mass production scale so that each chip has substantially same and good characteristics, it is desirable that the crystal structure of the epitaxial layer should be as near perfect as possible, with as few defects as possible. This goal has been generally achieved through the use of annealing and other crystal-perfecting techniques. It is the primary reason that the microelectronics industry has been able to continue to grow rapidly according to Moore's Law. It is desirable to continue the growth trend predicted by Moore's Law. However, many obstacles stand in the way.

Moore's Law predicts that transistor size will continue to shrink and the number of transistors on an integrated circuit die will double approximately every 18 months. This predictive law assumes that integrated circuits may only be laid out in a two-dimensional manner on one monocrystalline plane of silicon. Those skilled in the art recognize that the shrinkage of transistor size may not be able to go on forever. Eventually, fundamental limits of either the interconnect or transistor physics and economic realities will bring the shrinkage to a halt. While no definite limit has yet been established, it appears that a fundamental limit will be hit as transistors approach channel lengths of about 0.1 $\mu$m.

To overcome this expected problem, artisans are exploring ways to increase the amount of active surface area in each IC chip. Some practitioners have tried to extend the amount of surface area available to active devices by forming so-called thin-film transistors (TFT) in polysilicon layers of an integrated circuit chip. The polysilicon layers are deposited on insulating silicon dioxide layers, above the base monocrystalline layer of silicon. Unfortunately, the thin-film transistors of such polysilicon layers generally have poor electrical characteristics and poor reproducibility from one chip to the next. This is primarily due to the random distribution of polycrystalline grains of different crystal orientations within the drain, source and channel regions of each transistor. Also, there is the problem that doped polycrystalline silicon tends to have a substantially higher electrical resistance (about 15 $\Omega$/square) than does doped monocrystalline silicon (about 5 $\Omega$/square).

Another approach for extending the usable surface area of monocrystalline silicon is known in the industry as ELO (Epitaxial Lateral Overgrowth). Here, windows are created through a gate oxide or other oxide layer of the device to expose the underlying monocrystalline substrate. The exposed substrate area is then used as a seed for epitaxially growing new single-crystal material. The epitaxial material grows to extend through the window and to continue out onto the overlying amorphous silicon dioxide. This ELO technique has met with only limited success. One drawback of ELO is that it consumes part of the precious surface area of the monocrystalline substrate for seeding purposes and thereby works against its primary goal of increasing available area. Another drawback of ELO is that this form of monocrystalline growth cannot continue indefinitely. As distance from the seed window increases, there is a greater tendency to form polysilicon instead of single-crystal material.

Another approach worth mentioning is one called wafer bonding. Here, two or more monocrystalline wafers are bonded together for the purpose of increasing the available area of monocrystalline silicon within an integrated circuit package. However, this technique is burdened with problems relating to aligning the bonded wafers and forming interconnect between one wafer and the next. The wafer bonding process does not provide economies of scale in a mass production environment in the same, cost-effective way as do the more traditional methods for forming circuits on a monolithic substrate.

Another technology that is worth noting is one that creates so-called SOI (silicon-on-insulator) by means of a SIMOX process (separation by implantation of oxygen). Here, oxygen atoms are implanted at high energy and high dose to form a silicon dioxide insulating layer between the upper portion of an originally single-crystal substrate and the bottom bulk portion of the same substrate. Thermal annealing at high temperatures (e.g., 1000–1300° C.) is used to try to cure defects created in the upper crystal layer by the implantation therethrough of the oxygen atoms. SIMOX devices have the advantage of being able to operate at higher frequencies than devices formed directly on bulk substrate because the buried insulation layer reduces parasitic capacitance. However, the SIMOX process is relatively expensive due to the high costs of implanting the oxygen atoms and curing the implant-induced defects.

Another physical limit that is impeding progress in microelectronics is that of transistor switching speed. Charge carriers in monocrystalline silicon have limited mobility. Other materials exhibit higher mobilities and hence promise faster switching speeds. Because of this, practitioners have attempted to fabricate transistors using more exotic materials such as III–V semiconductor compounds (e.g., GaAs, GaAlAs, GaP, etc.) and II–VI compounds. These attempts have met with only limited success because of the difficulty of controlling the distribution of atoms within these materials on a reproducible basis from one chip to the next. It would be highly advantageous if the atomic organization of such exotic materials could be reproduced on a mass production basis from one chip to the next. The resulting, single-crystal III–V and II–VI materials may then be used to mass produce devices that operate at microwave frequencies. Additionally, if single-crystal forms of III–V and II–VI compounds could be created monolithically and economically in a same monolith that contains monocrystals of more traditional, column IV materials (e.g., Ge, Si, SiGe), then practitioners would be able to integrate more traditional Si/Ge-based circuits (e.g., microprocessor cores, memory cores, TTL interfaces, etc.) with higher frequency circuitry that relies on single-crystal forms of III–V and/or II–VI compounds. This would open up whole new possibilities in coupling slower-speed logic circuitry with higher-frequency communications circuitry.

It has been proposed that ultimately, as signal processing and communications speeds increase beyond the capabilities of purely-electronic devices that such operations may be taken over in part or in whole by optical devices. As is known, the utility of silicon is limited in optical applications because of silicon's indirect band gap. On the other hand, many III–V and/or II–VI compounds do not suffer from such limitations and can be used to provide optical functions such as photon detection, optical output and optical signal processing over a wide spectrum that covers at least the infrared through deep UV range. It would be highly advantageous if single-crystal forms of optically-active III–V and II–VI compounds could be created monolithically and economically integrated in a same monolith that contains monocrystals of more traditional, column IV materials (e.g., Ge, Si, SiGe) as well as single-crystal forms of electronically-active III–V and II–VI compounds. This would open up whole new possibilities in coupling slower-speed logic circuitry with higher-frequency communications circuitry and yet-higher speed optical systems. For example, more traditional forms of Si/Ge-based circuits (e.g., microprocessor cores, memory cores, TTL interfaces, etc.) could be coupled to high bandwidth optical communications systems that operate using single-crystal forms of III–V and/or II–VI compounds to provide integrated control and communications capabilities.

The Role of Single-Crystal Materials in the Other Industries

The use of single-crystal semiconductors in the semiconductor industry constitutes only the tip of the iceberg with regard to the general usefulness of single-crystal solid state materials. The superior mechanical hardness and other properties of many single-crystal materials may be used to improve the wearability and other characteristics of many products. For example, if it were possible to economically form single-crystal films such as made of diamond or $Al_2O_3$ or $SnO_2$, these might be used to provide improved tribology (low friction mechanical interfaces); more chemically-inert surfaces such as may be practical in medical applications; more thermally conductive packagings such as may be useful in electronics and other industries; and many other improved functionalities. In addition to formation of single-crystal semiconductors and single-crystal insulators, it is also often advantageous to form single-crystal metals and single-crystal superconducting compositions. The range of useful applications for such materials can include aerospace, optical, medical, machine tools, tribology and electronics. Some examples of single-crystal materials that may be advantageously formed in combination with non-single crystal materials include diamond, $Al_2O_3$, $SnO_2$, SiC, TiN, Ti, Hf, Zr, Cu, etc.

SUMMARY OF THE INVENTION

Processes, products and manufacturing apparatuses provided in accordance with the present invention overcome the above-mentioned problems. Methods are disclosed here for creating arrayed nucleation sites and growing Single-Crystals on the Arrayed Nucleation Sites (SCANS), where the latter sites are defined on otherwise nucleation-unfriendly surfaces.

A manufacturing system in accordance with the invention comprises: (a) particle accelerating means for accelerating template-forming particles in a channelizing direction; (b) channelizing mask means having one or more single-crystal channelizing masks through whose channels said template-forming particles may pass; (c) substrate support means for supporting a supplied substrate so that the substrate may receive template-forming particles passed through the channelizing mask means; (d) mask control means for detecting and/or controlling one or more of thermal states, vibrational states and positioning of the channelizing mask means; and (e) substrate control means for detecting and/or controlling one or more of the thermal states, vibrational states and spatial positioning of the supplied substrate; wherein the substrate control means is operatively coupled to the substrate support means; and wherein the mask control means is in cooperative communication with the substrate control means.

A method in accordance with the invention comprises the steps of: (a) aligning a beam of template-forming particles with a channel direction of a supplied, single-crystal channelizing mask (where the aligning can include electrostatic and/or magnetic manipulation of the ion beam or spatial repositioning of the channelizing mask, or both); (b) aligning a predefined plane of a supplied substrate to receive a projection of template-forming particles that have passed through the channelizing mask; (c) controlling temperature in the channelizing mask; and (d) controlling temperature in the supplied substrate.

A product in accordance with the invention comprises: (a) a single-crystal first material whose crystal cell units have one or more associated lattice constants; and (b) a second material having a bulk portion wherein one or more of the lattice constants of the first material are not regularly reproduced and further having a seeding-template portion which is regularly ordered to match, at least approximately, one or more of the lattice constants of the first materials, the seeding-template portion being bound to the first material.

Other aspects of the invention will become apparent from the below detailed description.

BRIEF DESCRIPTION OF THE DRAWINGS

The below detailed description makes reference to the accompanying drawings, in which:

FIG. 1C is a cross-sectional view showing a monocrystalline substrate with a single-crystal epitaxial layer being grown thereon by the conventional epitaxial growth method;

FIG. 4 is a cross-sectional view showing a manufacturing apparatus in accordance with the invention;

FIG. 5A is a cross-sectional view showing a first article of manufacture having single-crystal regions grown in accordance with the invention;

FIG. 5B is a flow chart of a process that may be used to manufacture the structure of FIG. 5A;

FIG. 7 is a cross-sectional view showing a process in which a substrate having multiple layers of different materials is exposed to a channelized beam of nucleating or knock-off particles and is thereafter subjected to epitaxial-like growth of single-crystal material;

DETAILED DESCRIPTION

Figure 1A:
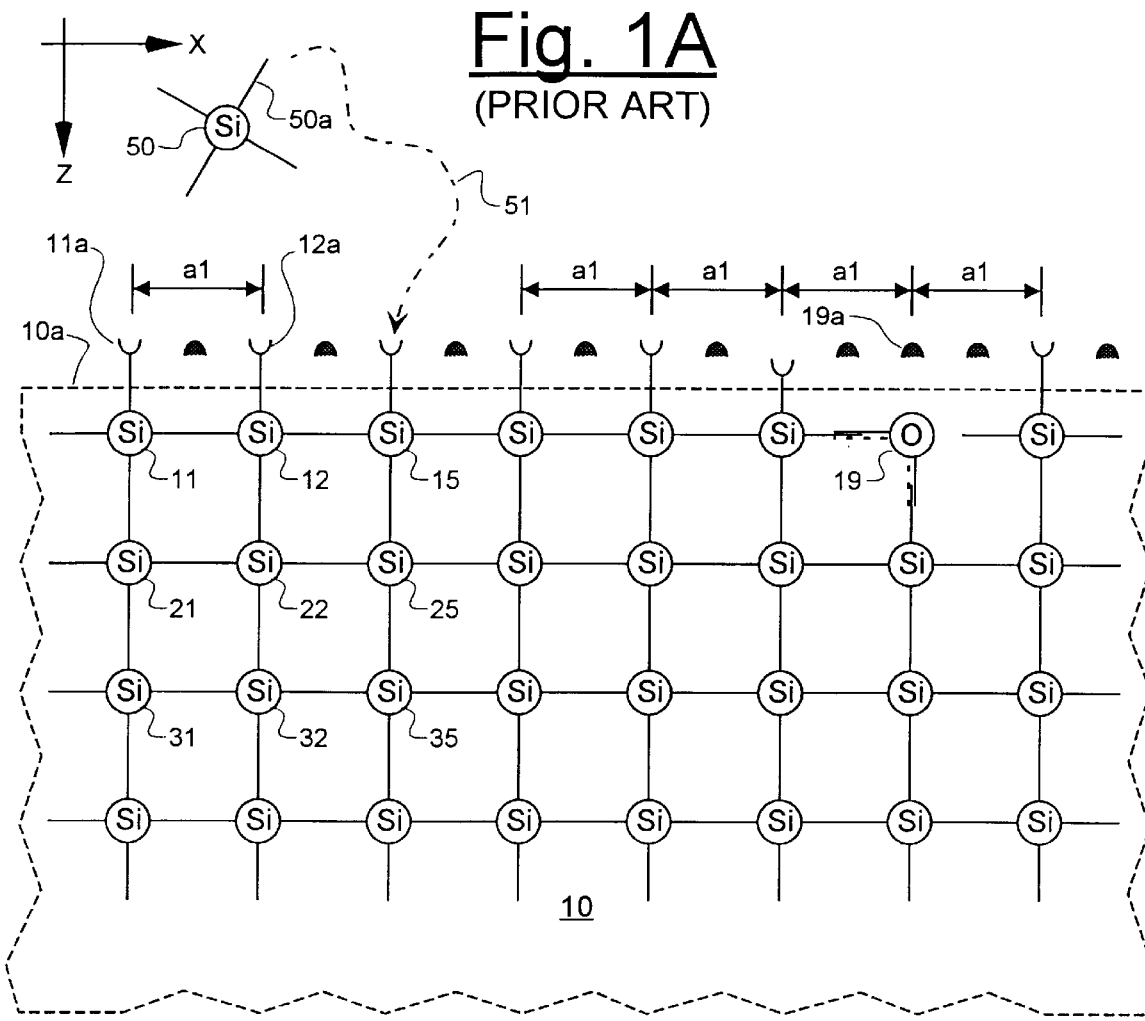
FIG. 1A is a cross-sectional view showing how conventional epitaxial growth begins on a single-crystal substrate, made for example of silicon.

In the cross-sectional view of FIG. 1A, dashed element 10 represents a monocrystalline substrate composed, for example, of silicon (Si). Substrate 10 has a top planar surface denoted as 10a which extends in the lateral X and Y directions. Circle 11 represents one atom of a regular array of spaced-apart, crystal-forming atoms which in this example are silicon but in general may be any atom that forms part of a generic, single-crystal substrate 10. As seen, atom 11 bonds with neighboring atoms such as 12, 21, etc., to form the repeating regular organization (a unit cell) of the monocrystalline substrate 10. This regular array of atoms is constituted mostly by empty space despite every day notions that solid state materials are solid. The atomic nuclei are relatively small and are spaced apart from one another by relatively large distances as may be shown by X-ray crystallography. For example, a silicon atom taken alone in a vacuum (not in a crystal) may be viewed as having an outside diameter (counting its electron orbits) of about one Angstrom (1 Å). The center to center spacing between atoms of a silicon single-crystal is about 5.43 Å at room temperature (300° K.). Accordingly, there is a significant amount of empty space between the atoms of a silicon single-crystal.

In general, the specific spacings between respective nuclei of a given single-crystal will vary depending on the three-dimensional organization of the crystal's unit cells and their constituent atoms. These cells may be cubic, or face-centered cubic (FCC), or body-centered cubic (BCC), or tetrahedral, or other as is well known in the art of crystallography. The example of FIG. 1A assumes a simple cubic organization with a (100) crystal orientation at surface 10a. A first unit-cell dimension, or lattice constant, a1 defines a first regular spacing between atomic nuclei in a first lateral direction, here the X direction. (As explained above, for silicon a1 is about 5.43 Å at room temperature.) A second unit-cell dimension, or lattice constant, a2 defines a second regular spacing between atomic nuclei in a second lateral direction, here the Y direction. (This Y direction is orthogonal to the YZ plane of FIG. 1A and in the example of a silicon single-crystal, a2 is the same as a1.).

Figure 1B:
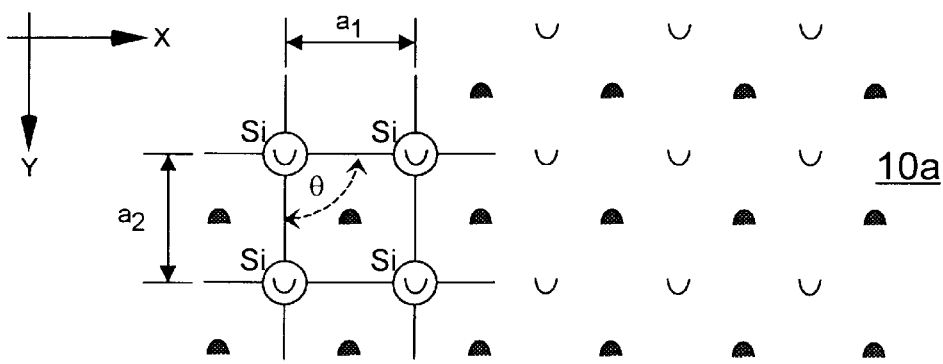
FIG. 1B is a top plan view showing the array of nucleation friendly sites and nucleation discouraging sites that an approaching atom sees during conventional epitaxial growth.

In general, a given single-crystal may have more lattice constants per unit cell than just the two lateral lattice constants, a1 and a2 shown in the top plan view of FIG. 1B. Such general lattice constants may differ from one another in length and may extend in directions other than the X and Y directions. The size of the lattice constants and their directions may vary depending on the crystal orientation along which plane 10a cuts through substrate 10. Crystal orientations are generally denoted in the art as (100), (111), etc.

Occasionally, there may be an imperfection in the monocrystalline lattice such as represented in the example of FIG. 1A by the intrusion of oxygen atom 19. For most applications, the appearance of a single imperfection 19 over a linear distance of many, otherwise perfectly arranged, crystal atoms is acceptable, and can be compensated for, as will be seen.

As is well known, silicon atoms (11) may be thought of as having four valence bonds by which they chemically combine with neighboring atoms. Thus, silicon atom 22 can conveniently bond at any instant of time within a regular cubic pattern to four neighboring silicon atoms such as represented two-dimensionally here by atoms 21, 25, 32 and 12. In the actual 3-dimensional crystal structure, the electron cloud of atom 22 may be thought of distributing itself symmetrically over time to bond on all 6 sides (left, right, top, bottom, front, back) with similarly extended neighbors. The single-crystal as a whole may be thought of as having a uniform, electron cloud distribution extending through it.

Silicon atom 12 is shown to be situated at the surface 10a of substrate 10 and therefore it does not have another silicon atom above it for bonding to. Silicon atom 12 may accordingly be portrayed as having a 'dangling bond' 12a that at times projects therefrom at the surface 10a of the substrate. Similarly, silicon atom 11 may be viewed as having a respective dangling bond 11a projecting therefrom at the surface 10a. Surface atom 15 similarly has its respective dangling bond at the surface 10a, and so forth. The distance between neighboring dangling bonds such as 11a and 12a is generally the lattice constant a1. These dangling bonds 11a, 12a, etc., may be thought of as relatively friendly attachment-sites for a soon-to-be described, incoming atom 50. Accordingly, a friendly-smile shaped (or upright U-shaped) symbol is used to represent these dangling Si bonds that project from the surface 10a.

In contrast, where there is no available attachment point or where the surface element is one that discourages bonding thereto by an incoming atom 50 (shown tumbling down toward surface 10a), a dark-filled upside down U-shaped symbol (e.g., one that looks like a sad mouth) is used to represent such an attachment-unfriendly characteristic (relatively speaking) at the corresponding surface site. An example is the symbol 19a shown above oxygen atom 19. Another example is the sad mouth symbol shown between the two happy-smile symbols, 11a and 11b.

In conventional epitaxial growth processes, which may be in the form of chemical vapor deposition (CVD) or other dry or wet growth processes, a free incoming species (e.g., a radical) such as atom 50 is presented in regions near the surface 10a of the substrate 10. A valence arm 50a of such a free atom tends to tumble randomly until it comes into alignment with and bonds to one of the attachment-friendly, dangling surface bonds such as that of silicon atom 15. Dashed path 51 indicates a possible travel path for valence arm 50a as it approaches silicon atom 15. In addition to atom 50, other free atoms of the epitaxial growth process will tumble in and attach to attachment-friendly, dangling bonds (e.g., 11a, 12a) on a generally random basis. The attached-to bonds may be on the original surface 10a or on new atoms (e.g., 50' of FIG. 1C) that have already attached to surface 10a.

FIG. 1B shows a top plan view of what the surface 10a of the monocrystalline substrate 10 looks like to an incoming atom such as 50 during conventional epitaxial growth. Here, the visible axes are the lateral X and Y directions. The Z axis extends down into the plane of the figure. The center-to-center distance between neighboring atoms of the cubic monocrystalline substrate of this example is generally denoted as $a_1$ for the X direction and $a_2$ for the Y direction. The angle between these laterally directed lattice dimensions, $a_1$ and $a_2$ can be other than the illustrated 90° if different kinds of materials with different crystal geometries are used or if a different crystal orientation is used. Accordingly, the inter-vector angle θ is shown for purposes of generally explaining that surface 10a presents itself as a planar template to which incoming atoms such as atom 50 will attach, essentially only at the attachment-friendly sites. As seen, the center of each silicon atom appears as a attachment-friendly or happy-face site to which the incoming atom 50 is more likely to bond. These attachment-friendly sites are spaced apart from one another in accordance with the surface defined lattice constants such as $a_1$, $a_2$ and lattice vector angles such as θ. Areas where there is no opportunistic and friendly bonding site are shown as 'sad mouth' symbols.

Referring to the cross-sectional view of FIG. 1C, it is seen that after a previously-free silicon atom such as 50' attaches to silicon atom 15' (both are referenced with primed numbers now because bonding alters their respective states), other free and incoming silicon atoms attach to other attachment-friendly sites along the original surface 10a. Substrate surface 10a therefore serves as an arrayed template for regenerating the crystalline matrix of the original monocrystal within substrate 10. Even in the case where there is an imperfection such as that represented by oxygen atom 19, neighboring silicon atoms reinforce the template and thus help to cure the imperfection. Thus, after silicon atom 16 bonds to a friendly site on surface 10a and silicon atom 18 bonds to another site that is spaced away by a distance twice as large as a1, silicon atom 17 is encouraged to bind in the correct place between silicon atoms 16 and 18 despite the presence of oxygen atom 19 below it. Thus the imperfection is generally cured and further layers of silicon atoms can grow without imperfection even over the imperfect site. In FIG. 1C, free silicon atom 150 represents the beginning of growth of yet another layer of epitaxial material.

Figure 2A:
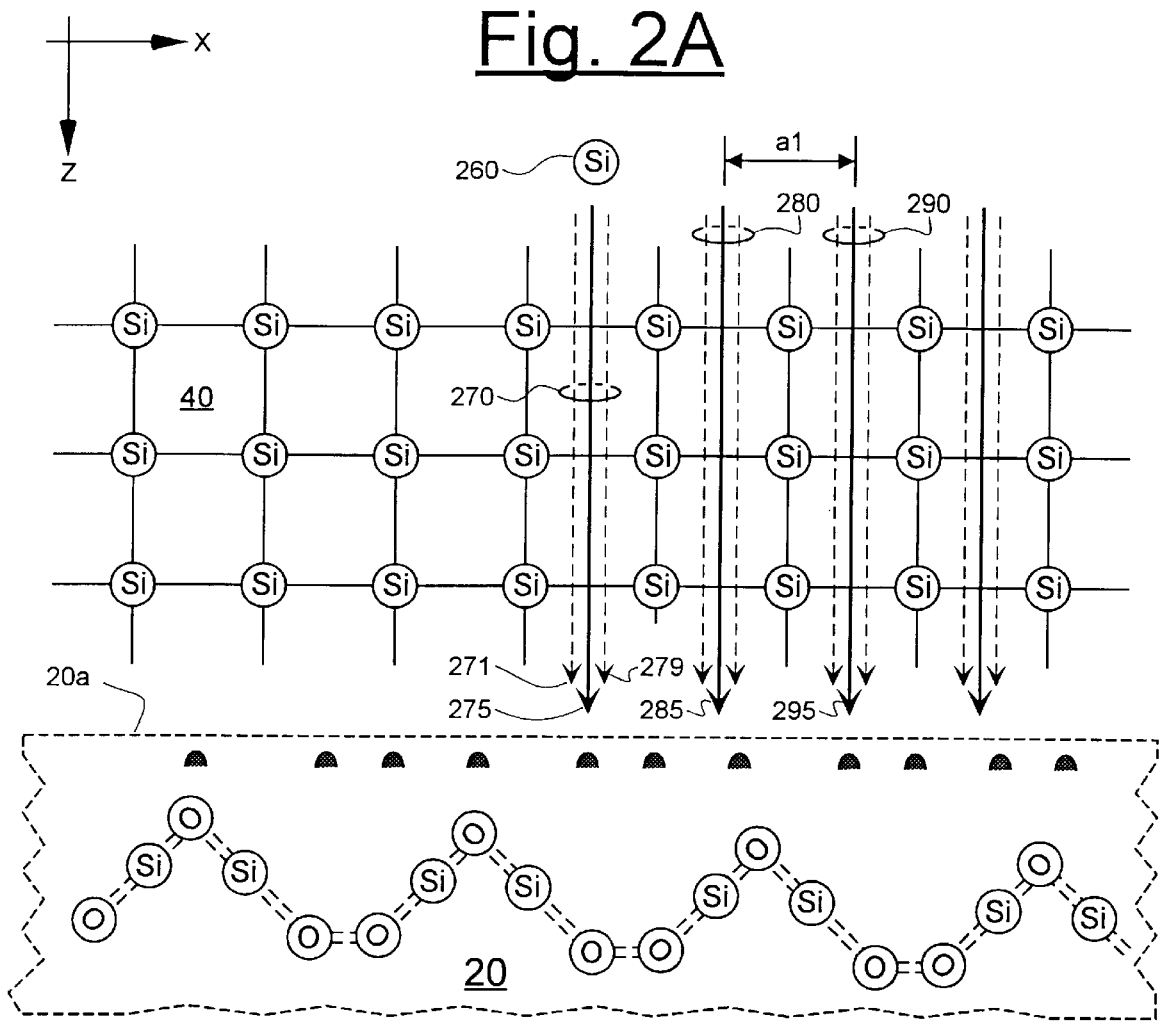
FIG. 2A is a cross-sectional view showing how a single-crystal channelizing mask may be used in accordance with the invention to implant nucleating particles into a non-single-crystal (e.g., amorphous) substrate such that spaced-apart nucleation sites are formed conforming to a single-crystal template.

In the cross-sectional view of FIG. 2A, substrate 20 represents in a general way, any material that has a nucleation unfriendly surface 20a, and that can accept implantation thereinto of a nucleating species, and that can afterwards sustain epitaxial-like growth as will become apparent. In one example, substrate 20 is composed of amorphous silicon dioxide ($SiO_2$) which, as known in the art, is unfriendly to epitaxial growth of monocrystalline silicon thereon. In alternate exemplary embodiments (not shown), substrate 20 is composed of a member from the group consisting of: other forms of silicon oxide (e.g., quartz), any form of a silicon nitride (e.g., $Si_3N_4$), any form of a silicon oxi-nitride (e.g., $Si_xO_yN_z$ where x,y,z>0) or another non-monocrystalline insulating material.

Further in FIG. 2A, element 40 represents a channelizing mask that is positioned over substrate 20 and consists of or comprises a monocrystalline material such as for example, silicon. In alternate exemplary embodiments (not shown), channelizing mask 40 may consist of or be comprised of other single-crystal semiconductor materials such as Ge (whose a1=5.66 Å at 300° K.) and GaAs (whose a1=5.65 Å at 300° K.).

Channelizing mask 40 is aligned relative to the original upper surface 20a of the substrate so as to hypothetically project onto substrate surface 20a an 'anti-shadow' that corresponds to the regular lattice spacings of the monocrystalline material (or materials) in mask 40. By 'anti-shadow' it is meant here that if a hypothetical light of infinitesimally small wavelength were to be shined down through the channelizing mask 40, some of the light will be blocked by columns of atoms in the mask 40. The light that succeeds in passing through mask 40 without intersecting with a column of atoms of mask 40 would form bright spots (conceptually speaking here) on the substrate surface 20a. This projected-through hypothetical light or 'anti-shadow' would have a regular pattern that complements the shadow cast by the projecting of the hypothetical light down through the channelizing mask 40. Just as the shadow cast by this hypothetical exhibits a regular pattern that mimics the pattern of atoms in the mask 40, the anti-shadow also exhibits a regular pattern whose spacings and loci correspond to the pattern of atoms in the mask 40. In other words, the spatial frequency of the anti-shadow pattern follows the spatial frequency of the cast shadow and both correspond to the spatial frequency of columns of atoms found in mask 40, where the atoms that define each column may vary according to the crystal orientation of mask 40.

Instead of projecting beams of hypothetical light through channelizing mask 40, in accordance with one aspect of the invention, beams of a nucleating species are projected through the 'channels' or spacings between the columns of atoms in mask 40. The projected-through beams (e.g., 270, 280, 290) are implanted into substrate 20 in accordance with the anti-shadow cast by mask 40. The greater concentrations of implantation should occur at the central axes (e.g., 275, 285, 295) of the channels of mask 40.

Steps should be taken to keep the relative positionings of the spaced-apart implant beams 270, 280, 290 substantially the same relative to positionings of their initial implant sites in substrate 20. Temperature should be tightly regulated so that thermal vibrations and thermal expansion or contraction does not play havoc with these atomic-level positionings. In one embodiment, each of the substrate 20 and channelizing mask 40 is kept at a constant, preferably cold temperature, below room temperature (below about 300° K.) and preferably as low as that of liquid nitrogen (about 77° K.) or even lower. At least the channelizing mask 40 should be kept cold so as to retard, if not prevent amorphization of the mask due to large numbers or high doses of passing-through beams.

In an alternate or superposed embodiment, the thermal states of substrate 20 and channelizing mask 40 are carefully monitored and implants of the nucleating species 260 are made in snapshot or burst fashion at time points that are in phase with detection of simultaneous occurrence of predefined thermal states (e.g., temperature saddles) of the substrate 20 and channelizing mask 40. Additionally, all other vibrational sources for creating misalignment at the atomic-distance scale between the nucleation-particle introducing beams 270, 280, 290 and the initially created, attachment-friendly sites in substrate 20 should also be suppressed. This can be accomplished with piezoelectric position-control systems, laser interferometers, or the like. More will be said about this when FIG. 4 is discussed.

In one embodiment, the nucleating species 260 includes free silicon atoms. In alternate embodiments, the nucleating species 260 may include any other free atoms which can be additively implanted into substrate 20 to create attachment-friendly sites. The alternate nucleating species may include Ge, or Ga, or As, or P, or carbon, or metal elements and so forth as appropriate for the single-crystal that is intended to be next grown from the implant-altered surface 20b of the substrate 20.

The distribution of nucleating atoms such as 260 (e.g., a silicon atom) relative to their implant position in substrate 20 is represented generally by the three-arrowed symbol 270. The central arrow 275 represents the primary contribution of implant dose into substrate 20, this being at essentially the center of the channel between the neighboring columns of silicon atoms in the channelizing mask 40. Dashed side projections 271 and 279 represent minor contributions from the energetic projection of the nucleating species 260 through the corresponding channel of mask 40. As should be understood, the statistically significant portion of the implant through each respective channel is represented by the main projection arrow 275 or its like 285, 295, etc. in adjacent channels. Implant venergies and densities may vary depending on the intended next steps.

Figure 2B:
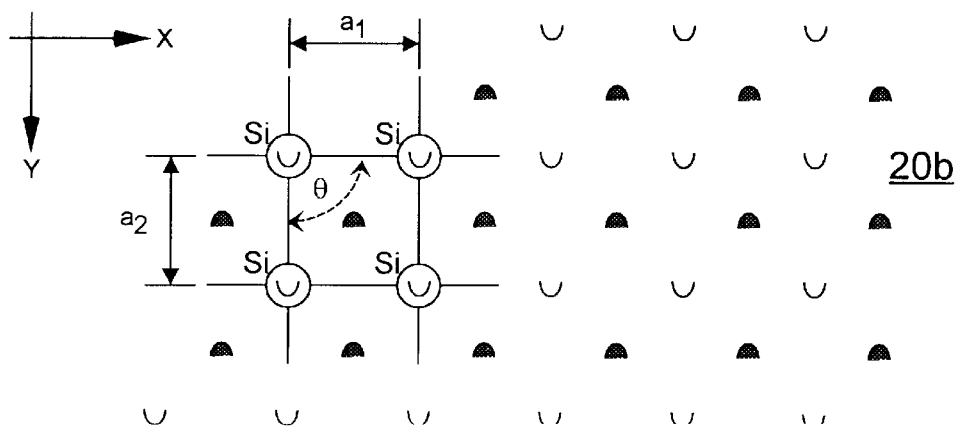
FIG. 2B is a top plan view of what the surface (or a later-exposed deeper layer) of the substrate of FIG. 2A looks like after implantation completes.

When implantation through the channelizing mask 40 completes, the top surface of substrate 20 (or a deeper layer if high implant energies are used) should be altered to have the appearance of 20b as shown in the top plan view of FIG. 2B. Here it is assumed that the implant energies were sufficiently low so that a substantial number of the nucleating atoms (260) came to rest relatively close to or on the top surface 20b of substrate 20. If higher energy levels were used and the implant depth was deeper, an upper portion of the original surface 20a may be etched away or otherwise removed to expose the deeper layer which has the spaced-apart nucleation sites. The removal can be blanket wise or selective, where the latter selective removal may be accomplished with the use of a lithographically-defined etch mask and RIE (reactive ion etch) or other like means.

As seen in FIG. 2B, the spaced-apart nucleation sites (attachment-friendly sites) present to incoming deposition atoms (250 of FIG. 2C) essentially the same opportunities for arrayed attachment as does the template pattern shown in FIG. 1B. In other words, implant-altered surface 20b presents itself in essentially the same way as surface 10a of a monocrystalline substrate 10 presents itself to incoming deposition atoms. The difference in FIG. 2B is that the underlying substrate 20' (see FIG. 2C) is generally composed of a nucleation unfriendly material such as amorphous silicon dioxide or another material that is unfriendly to epitaxial-like growth of the next deposited atoms (e.g., 250 of FIG. 2C). In contrast, the underlying substrate 10 of FIG. 1B consists essentially of the nucleation friendly atoms, 21, 22, 25, 31, 32, 35, etc., all positioned according to the regular pattern of the crystal that is to be next grown above them.

Figure 2C:
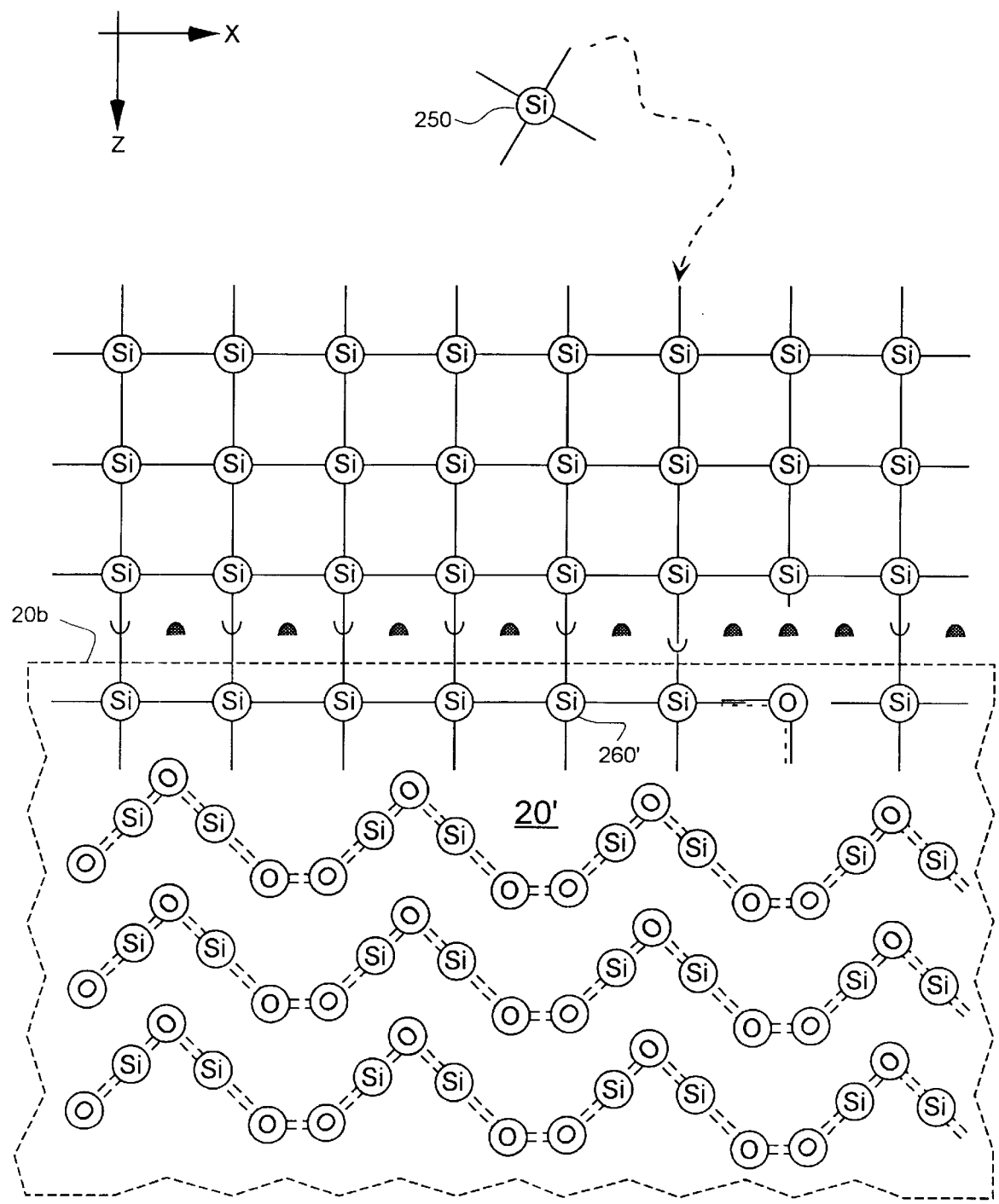
FIG. 2C is a cross-sectional view showing a substrate having nucleating particles regularly implanted therein in accordance with FIG. 2A and further showing the epitaxial-like growth of a monocrystalline layer thereon.

As seen in the cross-sectional view of FIG. 2C, the nucleation template offered by the implant-altered surface 20b of the substrate of FIG. 2A appears to incoming atoms, such as to the to-be-deposited atom 250, to be essentially the same as the template offered by the convention monocrystalline substrate 10 of FIGS. 1A–1C. Accordingly, a monocrystalline epitaxial layer may be grown on top of surface 20b based on basically the same physics as are present in the conventional epitaxial growth process of FIG. 1C. Atom 260' is one of the nucleating atoms that was added in spaced-apart fashion to the now-altered substrate 20' by the nucleation-species adding process of FIG. 2A.

Figure 3A:
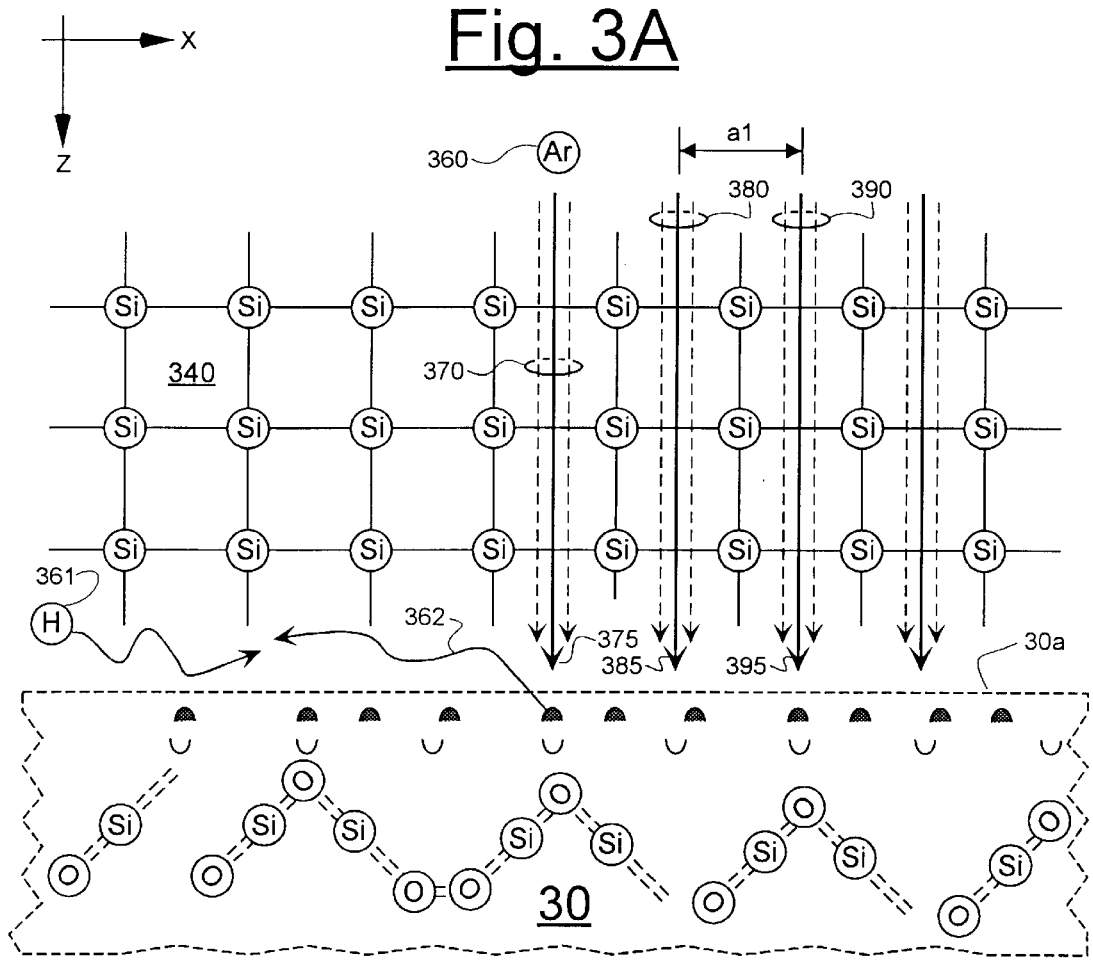
FIG. 3A is a cross-sectional view showing a subtractive method in accordance with the invention for forming spaced-apart nucleation sites that mimic the template of a monocrystal.
Figure 3B:
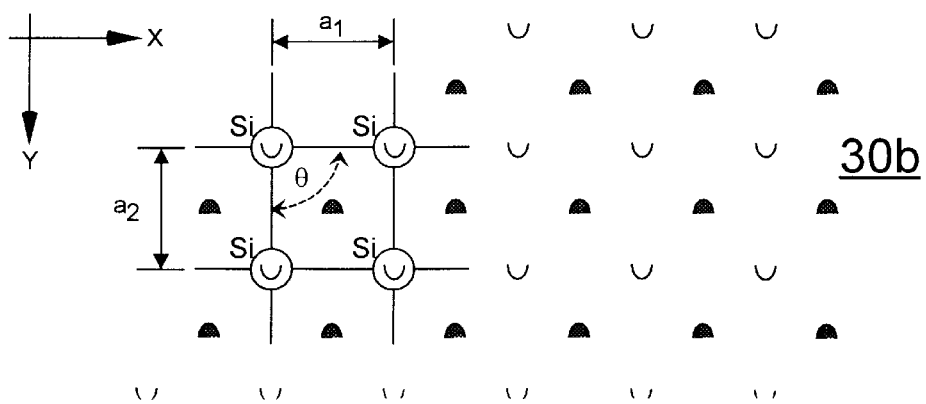
FIG. 3B is a top plan view showing how the surface of the substrate of FIG. 3A may appear after the subtractive process completes.

FIG. 3A shows an alternate, subtractive approach for creating spaced-apart nucleation sites (attachment-friendly sites) on an epitaxial-growth unfriendly surface 30a of a supplied substrate 30. Here, nucleation unfriendly elements such as the oxygen in the illustrated example of amorphous $SiO_2$ (or quartz) are knocked away or subtractively removed by bombarding the surface 30a with a knock-off species 360 such as argon (Ar) or helium (He) or fluorine (F). The bombarding species 360 is passed through channelizing mask 340 as beams 370, 380, 390, etc. so that removal of nucleation blocking or nucleation-unfriendly elements (e.g., oxygen) occurs only at spaced-apart locations in accordance with the desired lattice constant, a1. Path 362, for example, represents the knocking away of a nucleation blocking particle from the surface 30a of the substrate when that specific surface point is hit by a particle of central beam portion 375. Similar knock-offs should occur at numerous other loci such as those hit by beam central portions 385, 395, etc. A scavenging agent 361, such as composed of gaseous hydrogen (H) or carbon radicals (e.g., $CH_3+$) for example, is preferably passed along the surface 30a of the substrate 30 at low pressure (e.g., less then 100 mTorr) during bombardment so as to combine with and volatilely remove the knocked-off oxygen atoms. In a more general sense, the knocked-off atoms are a nucleation blocking or inhibiting element that covers a nucleation friendly other element (e.g., Si) within the substrate 30. The nucleation blocking elements can even be a monolayer that was deposited on substrate 30 to create a contrasting background from which spaced-apart portions are removed (e.g., 362) by the bombardment by knock-off species 360. As such, when the nucleation unfriendly element is removed, that leaves behind on the altered surface 30b nucleation friendly sites spaced apart within a contrasting, attachment-unfriendly background in accordance with the desired template. This is seen in the top planar view of FIG. 3B. Again, the channels pattern of the channelizing mask 340 can cause the altered surface 30b of the bombarded substrate 30' to appear generally the same to incoming deposition particles (350, FIG. 3C) as does the surface template (FIG. 1B) that is presented by a monocrystalline substrate 10 in a conventional process (FIG. 1C).

With regard to the bombardment energies and densities that are used for knock-off particles 360, this may vary in accordance with the next intended steps. In general the energies should be high enough to perform the knock-off function and not too high such that particles 360 instead implant deep inside substrate 30 without removing a nucleation-blocking element.

Figure 3C:
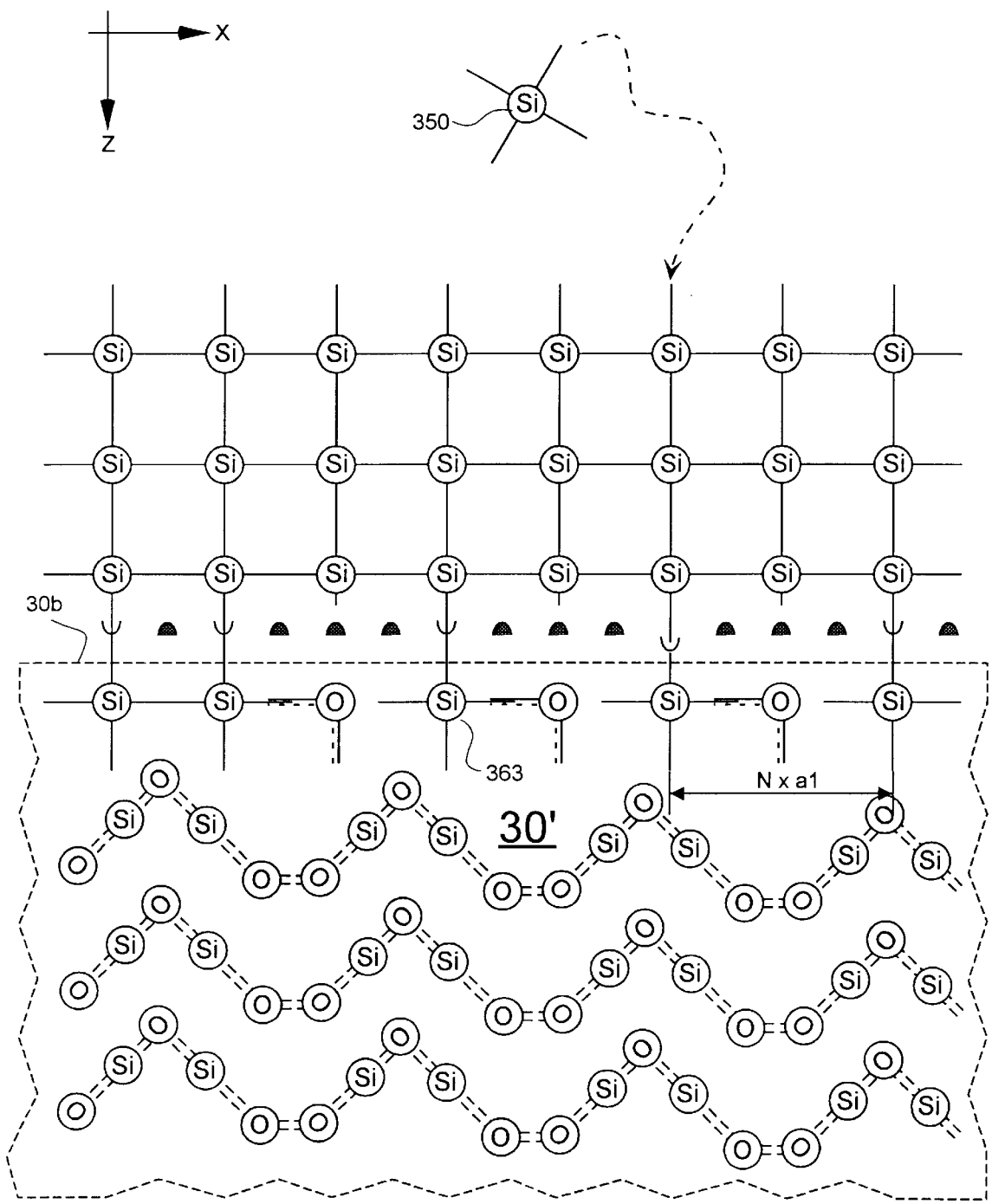
FIG. 3C is a cross-sectional view showing a monocrystalline layer growing in epitaxial-like manner on the substrate of FIG. 3B.

Referring to the cross-sectional view of FIG. 3C, Si atom 363 is an example of an attachment-friendly particle that was exposed by the channelized bombarding process of FIG. 3A. Even if the knock-off process is not 100% perfect, and an attachment-friendly particle (e.g., 363) is not exposed by every beam (370, 380, 390), the exposed nucleation friendly spots will still be generally spaced apart from one another by whole-number multiples of the desired lattice constants (e.g., N×a1, where N is a whole number) and thus an appropriate template for encouraging growth of monocrystalline material at the right places, and discouraging attachment at the wrong places, will be present.

Again, as in the case of the additive process of FIG. 2A, the temperatures of the channelizing mask 340 and substrate 30 should be tightly controlled to maintain alignments between the knock-off beams 370, 380, 390 and the initially created, attachment-friendly sites (e.g., 363) in substrate 30. And, of course all other vibrational sources for creating misalignment at the atomic-distance scale between the knock-off beams 370, 380, 390 and the initially created, attachment-friendly sites in substrate 30 should also be suppressed.

Figure 3D:
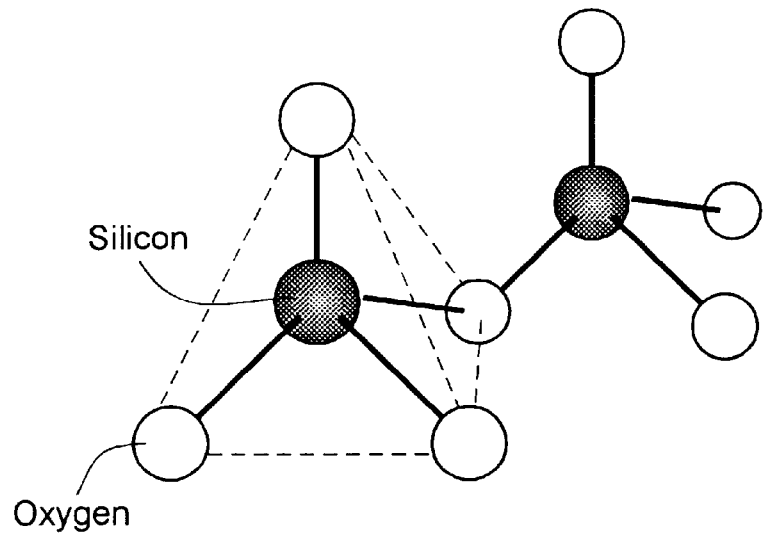
FIGS. 3D–3E are isometric views for showing how the knock-off technique of FIG. 3A may work for a substrate having tetrahedral units of silicon dioxide.
Figure 3E:
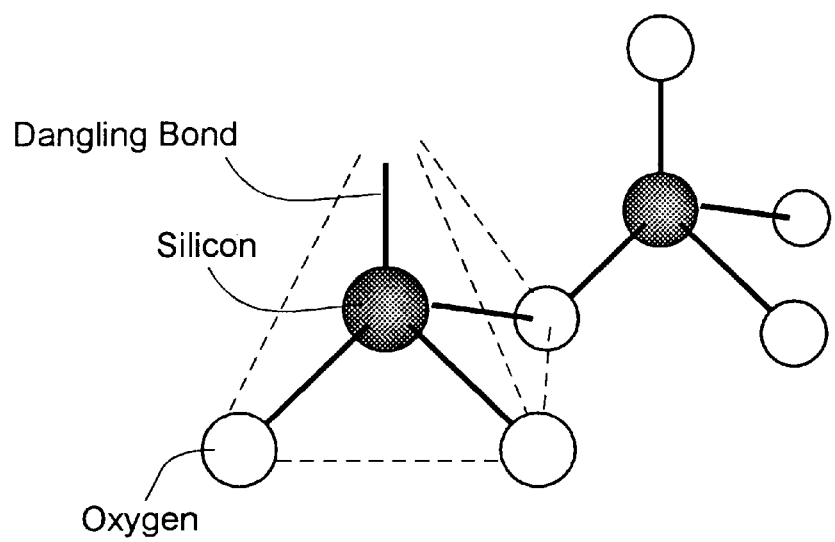

FIGS. 3D–3E illustrate how knock-off may work in the case of an $SiO_2$ substrate. Each Si atom is generally caged within a tetrahedral formation of oxygen atoms as shown in the isometric view of FIG. 3D. When knock-off particles such as 360 (FIG. 3A) approach this tetrahedral formation, the oxygen atoms are most likely to be impacted first. The silicon atom within each tetrahedral is generally shielded from the first salvo of knock-off particles by its surrounding oxygen atoms. Accordingly, and as seen in the isometric view of FIG. 3E, a first salvo of knock-off particles that is tailored to knock off only the first monolayer of atoms in the supplied substrate will generally knock off the oxygen atoms at positions corresponding to the channels of the channelizing mask 340. Dangling silicon bonds will therefore be left at the surface of the substrate for seeding the single-crystal growth of the next-deposited material (e.g., 350). Spacings between such dangling silicon bonds of FIG. 3E will generally conform with the distance, N×a1, as shown in FIG. 3C, where a1 is a lattice constant of the channelizing mask 340.

Referring to the cross-sectional view of FIG. 4, in a substrate-processing system 400 of the invention, a particle accelerator 401 (such as an ion implanter of the type used in doping semiconductors) is provided above a channelizing mask 440. The channelizing mask 440 is disposed above, and preferably spaced apart by a distance $d_Z$ of about 100 μm or greater from a top planar surface 420a/b of a supplied substrate 420. Prior to processing, surface 420a of the substrate has the general characteristic of being nucleation-unfriendly as indicated by the sad mouth symbols such as at 421. After processing, the resulting surface 420b (or a deeper layer if a deep-implant additive process is used, see 522 of FIG. 5A) will have regularly spaced-apart nucleation-friendly sites.

In FIG. 4, a statistical approach is used for defining what a nucleation-friendly site looks like. Particle accelerator 401 supplies a process-specified dose of nucleating or knock-off particles such as 61 at process-specified times, through the channel of beam 470 to position $X_1$, where the accelerated particles (e.g., 61) have one or more process-identified energies.

Nucleation or knock-off particle 61 is a member of the beam 470 that successfully passes through a crystal channel defined between a first column of crystal atoms: 41, 43, 45 and a second column of crystal atoms: 42, 44 and 46 within means mask 440. At the instant when a member (e.g., atom 61) of beam 470 impacts the substrate 420, the lateral location of that member (relative to the lateral X and Y axes) may vary statistically by a finite amount. Most particles (e.g., 61) will align with the central axis of beam 470. A few, however, will be dispersed laterally due to system noise. Generally, the dispersion will follow a Gaussian pattern. A first Gaussian-like dispersal pattern is shown at 422. The lateral center of the pattern 422 corresponds with position $X_1$. The X, Y, Z reference frame is to be considered here as being fixed onto a single point of substrate 420. Atoms within mask 440 may move relative to this X, Y, Z reference frame.

Gaussian distribution pattern 422 is plotted horizontally relative to the X axis and vertically relative to an implant-density axis (IDx). An effective density deviation (peak minus background level) of pattern 422 is represented by a first height 422a.

Gaussian-like plot 425 represents the depth distribution of beam 470. Pattern 425 is plotted vertically relative to the Z axis (which projects down from the top surface 420a/b) and horizontally relative to the local implant density (IDz) of beam 470. As seen, the peak implant-density of pattern 425 occurs at a depth designated as rp. Those skilled in the art understand that the value of rp and the specific shape of pattern 425 will depend on the ballistic energy or energies of the projected particles (e.g., 61) of beam 470. The peak implant dose (IDz(max)) of pattern 425 will depend on the dosage density of beam 470. The lateral dispersal pattern 422 is multiplied against the vertical dispersal pattern 425 to determine what the specific distribution of nucleating/knock-off particles is at each given depth (Z value) and each lateral position within substrate 420. The contributions from adjacent beams to each point may be superposed with those of beam 470.

Due to thermal and other kinds of noise, vertical columns such as first atoms column 41/43/45 and second atoms column 42/44/46 of mask 440 may shift in position relative to the X axis (which axis is fixed on a point in substrate 420). For example, at a first instant in time ($t_1$), mask atom 41 may vibrate to the right by a small amount $+\Delta x_1$. This perturbation is indicated by the dashed replica of atom 41, to its right. At another instant in time ($t_2$) mask atom 42 may shift to the left by an amount $-\Delta x_2$. Atomic perturbations $+\Delta x_1$ and $-\Delta x_2$ can function to reduce the effective width of the channel between the first atoms column 41/43/45 and the second atoms column 42/44/46 of mask 440. For the case where mask 440 consists of monocrystalline silicon, each constituent atom 41, 42, etc. is approximately 1 Å in diameter or less. The lattice constant is 5.43 Å. This leaves approximately 4.4 Å of free channel width space for beam members such as 61 to pass through without striking a mask atom. However, if vibrational perturbations such as $+\Delta x_1$ and $-\Delta x_2$ are allowed to become too large, the statistical distribution of implanted particles in substrate 420 may degenerate from the highly differentiated, lateral dispersion pattern 422 to the substantially less differentiated lateral dispersion pattern 423. In other words, the desired, channelized implant (as represented by patterns 422, 424) may degenerate into a randomized implant. Note that the effective differentiating spread 423a of the second lateral dispersion pattern 423 is positioned higher and is smaller than the differential spread 422a of the first pattern 422. Such a degeneration of the lateral dispersion pattern from 422 to 423 is undesirable. Instead, the goal is to have multiple, highly differentiated dispersal patterns such as 422 and 424 with the spacing between the central axes of these patterns 422, 424 being equal to the desired lattice constant a1. Lateral dispersal pattern 424 belongs to the next adjacent channel as indicated by the dash-dot connection line 426.

To prevent thermal and other forms of noise from interfering with the production of highly-differentiated dispersal patterns such as 422 and 424, tight control should be maintained over the relative positionings of mask 440 and substrate 420 as well as over the thermal states of both the mask 440 and the substrate 420. To this end, system 400 includes a mask alignment/temperature control unit 404 that couples by way of bidirectional coupling 414 to the channelizing mask 440. A mask supporting portion of unit 404 includes a mechanically strong support base for holding the relatively thinner channelizing mask 440 in position. An aligning portion of unit 404 may include piezoelectric fine positioning elements or other fine positional controls as is known in the art of reticle positioning within the semiconductor industry.

The temperature control portion of unit 404 should include means for either maintaining mask 440 at a predefined cold temperature, preferably close to that of liquid nitrogen and/or means for detecting the thermal state of mask 440 and reporting the same to a central control unit (a process-controlling computer, not shown).

Similarly, the spatial position and thermal or other vibrational states of substrate 420 are to be tightly controlled by a substrate alignment/temperature controlling unit 405. Substrate controlling unit 405 is operatively coupled to a stepper chuck 410 that supports substrate 420. The stepper chuck 420 may include substrate temperature control means for defining the temperature of the substrate 420. Here, too, the temperature of the substrate should be kept relatively cold, preferably close to the temperature of liquid nitrogen. Steps should be taken to prevent thermal expansion or contraction of mask 440 and substrate 420 during the implanting (or knock-off) process. Coupling 412 represents a bidirectional sensing of the thermal and other states of substrate 420 and of control of the position and thermal state of substrate 420. The detected state of substrate 420 is reported to the central system controller (the process-controlling computer, not shown). It is understood that stepper chuck 410 is movable in the X, Y directions so that different 'reticle' areas of substrate 420 may be brought under mask 440 for receiving respective, channelized doses of the nucleation-friendly or knock-off species 61.

Substrate control unit 405 cooperates operatively with mask control unit 404 to maintain the desired spatial relationship between the mask and the substrate and to also maintain the desired consistency of thermal, vibrational or other states between the mask 440 and the substrate 420. Bidirectional coupling 415 represents the cooperative interaction between mask control unit 404 and substrate control unit 405.

The particle accelerator 401 should also be aligned with respect to the channelizing mask 440 and the substrate 420 so as to optimize the parallelism between particle beams (e.g., 470) supplied by accelerator 401, the channels in mask 440, and the perpendicular of substrate surface 420a/b. To this end, a beam source controlling unit 402 is further provided and operatively coupled as indicated by 417 to the particle accelerator 401. Control of the direction of the particle beams can include electrostatic and/or magnetic manipulation of the ion beam or spatial repositioning of the beam source 401, or both. Coupling 417 can include a goniometer for defining the spatial relationship between accelerator 401 and channelizing mask 440. Construction of goniometers is well known in the semiconductor industry and these are used for providing fine, three-dimensional control of the spatial relationship between ion implanters and, for example, semiconductor wafers.

Coupling 418 represents cooperative communication between the beam source control unit 402 and the mask and substrate control units 404 and 405. It may be desirable to activate the particle accelerator 401 only during times when mask controller 404 and substrate controller 405 report to the beam source controller 402 that both the mask 440 and the substrate 420 are simultaneously in acceptable spatial and vibrational (e.g., thermal) states. Beam control unit 402 also establishes the energy level and dosage densities of the particles produced by accelerator 401. These may vary depending on the desired results. During initialization or periodic recalibrations of system 400, it may be desirable to measure the particle beam intensity as seen at or just above the top of stepper chuck 410. To this end, one or the other of chuck 410 and substrate control unit 405 may include a beam detector for measuring beam intensity as seen at the chuck after passing through channelizing mask 440. The measurements may be used for aligning two or more of the beams 470 from accelerator 401, the channels of channelizing mask 440 and the perpendicular of the top surface of stepper chuck 410 one to the other.

FIG. 5A provides a cross-sectional view of a structure 500 that may be formed using the process depicted in the flow chart of FIG. 5B. Substrate 520 is initially nucleation-unfriendly at its original top surface 520a as indicated by symbols 521. The top surface 520a may initially extend continuously in the lateral directions (X,Y) as a planar top surface.

At step 551 of process 550, nucleation-friendly particles are implanted in spaced-apart relation through a channelizing mask to a mean depth indicated by 525.

In a following step 552 of the process, troughs are selectively etched into substrate 520 to the depth of lower surfaces 520b to thereby expose at the bottom of the troughs the spaced-apart nucleation-friendly sites 522 formed by the channelized implant.

At next step 553, single-crystal material is selectively grown in the troughs up to a height 530. This height 530 may be the same or slightly below or above the initial surface 520a of the substrate. The exposed nucleation-friendly sites 522 define the growth template or seed for this epitaxial-like growth process.

Planarization step 554 is optional. If no further planarized surface is needed in the device, it may be omitted. If planarization (e.g., by chemical, mechanical polishing or other means) is desired, height 530 should be made as close as possible (within practical tolerances) to the level of original surface 520a so as to minimize the amount of time, energy and resources that will be consumed by planarization step 554.

In the case where original substrate 520 is composed of an insulating material (e.g., a silicon oxide or a silicon nitride) and the grown single-crystal material 530 is composed of a semiconductor material, insulatively spaced-apart device areas will be formed. These may be used for implementing high frequency electronic circuits or other devices as desired.

In the case where original substrate 520 is composed of a semiconductor material (e.g., silicon, GaAs, etc.) and the grown single-crystal material 530 is composed of one or plural layers of metal (e.g., Ti, W, TiW, Hf, etc.), the top of the growth 530 may extend higher than surface 520a to create metal contact bumps. As such, spaced-apart contact areas will be formed. These may be used for implementing bonding pads or ball-grid like contacts. (Of course, an implant-blocking mask may be lithographically defined on the substrate prior to the channelizing implant to protect sensitive parts of the substrate from being poisoned by the implant.)

Figure 6A:
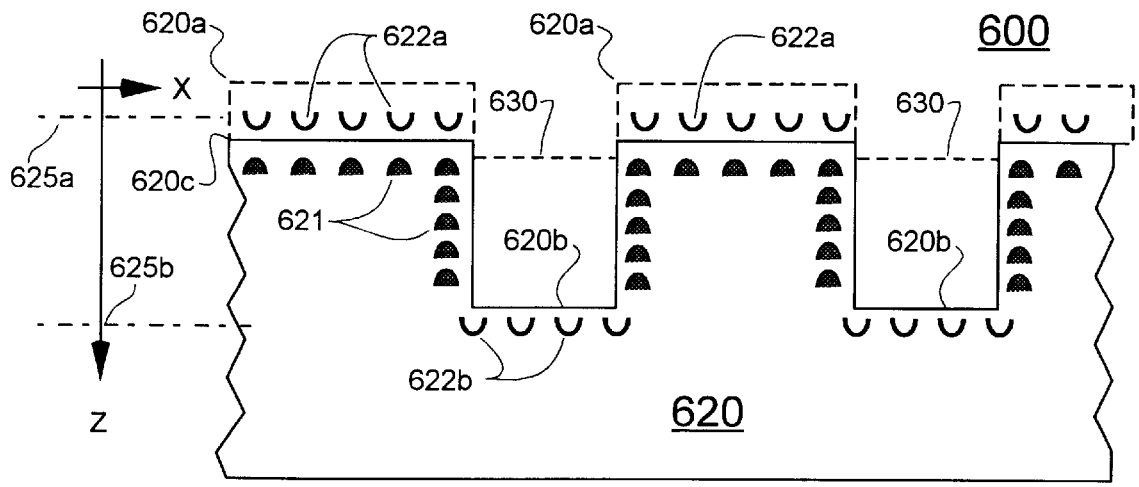
FIG. 6A is a cross-sectional view showing a second article of manufacture having single-crystal regions grown in accordance with the invention.
Figure 6B:
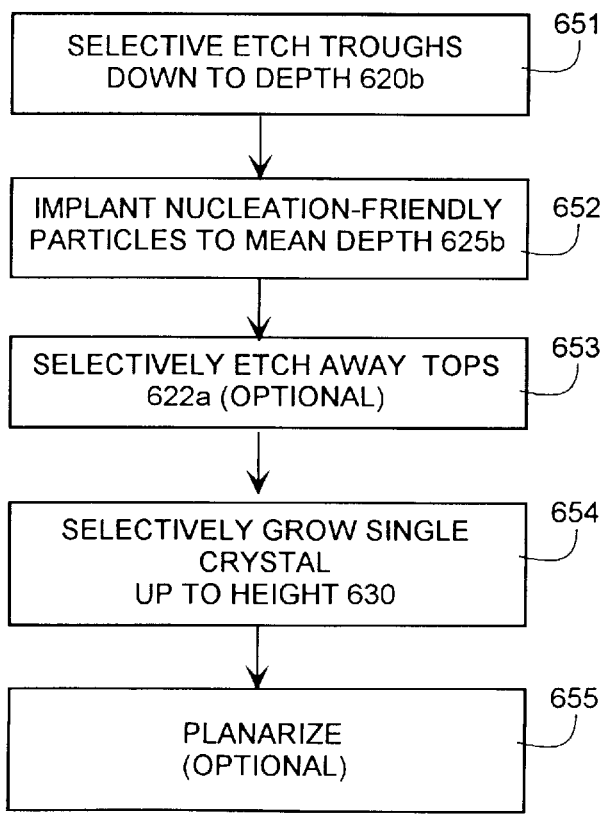
FIG. 6B is a flow chart of a process that may be used to manufacture the structure of FIG. 6A.

FIG. 6A is a cross-sectional view of another structure 600 that may be created using the process 650 of FIG. 6B. Level 620a represents portions of an original, planar top surface of substrate 620 before troughs are created. Again, the substrate 620 is composed of a nucleation-unfriendly material such as a silicon oxide or a silicon nitride or a silicon oxi-nitride. At step 651 troughs are selectively etched into substrate 620 to the illustrated depth of trough bottom surfaces 620b (or higher if 620a is later etched down).

At step 652, either a nucleation-friendly implant is made through a channelizing mask to a mean depth of the ultimate trough bottoms 625b or a knock-off process is carried out in accordance with the invention to provide nucleation-friendly sites 622a and 622b.

In step 653, the material containing nucleation-friendly sites 622a at the top of the substrate may be selectively removed, if desired, to form a new top surface 620c for the substrate. Step 653 is optional.

In next step 654, a single-crystal material is grown from trough bottoms 620b up to height 630 within the troughs of the structure. The desired height 630 will vary depending on whether the plateau material 622a was removed or not. If it was, height 630 will generally be approximately equal to level 620c. If it was not, height 630 will generally be below the bottom of the single-crystal material that was grown using nucleation-friendly site 622a. The following planarization step 655 is optional depending on whether additional layers are to be formed that call for a planar surface.

The fill material 630 of the illustrated trenches (having bottoms 620b) is not limited to semiconductor materials. For example, fill 630 may be a single-crystal, first optically-transparent material having a first refractive index while the substrate 620 has a different, second refractive index. In such a case, fill 630 may define an optical waveguide that is monolithically provided in substrate 620 for transmitting optical signals. The optical signals may be ones that continue beyond the bounds of the monolith and thereby provide inter-device, optical communication between spaced apart monolithic devices. Single-crystal optically-active materials may be further grown in accordance with the invention to monolithically define in the same monolith, heterojunction photodetectors and/or optical output devices such as LED's and solid state lasers.

Alternatively, fill 630 may be composed of a monocrystalline, high $T_c$ temperature superconductor (e.g., one having a transition temperature above about 77° K.) that is used for conducting electrical currents with minimal power loss. Examples of such high $T_c$ temperature superconductors include YBCO (yttrium-barium-copper-oxygen) compounds such as $YBa_2Cu_3O_{7+\delta}$, and another compound is $Hg_{0.4}T_{11.6}Ba_2Ca_2Cu_3O_{10-\delta}$, where $\delta$ indicates minor compositional variation. Growth can be by MOCVD (metal-organic CVD) processes.

Figure 6C:
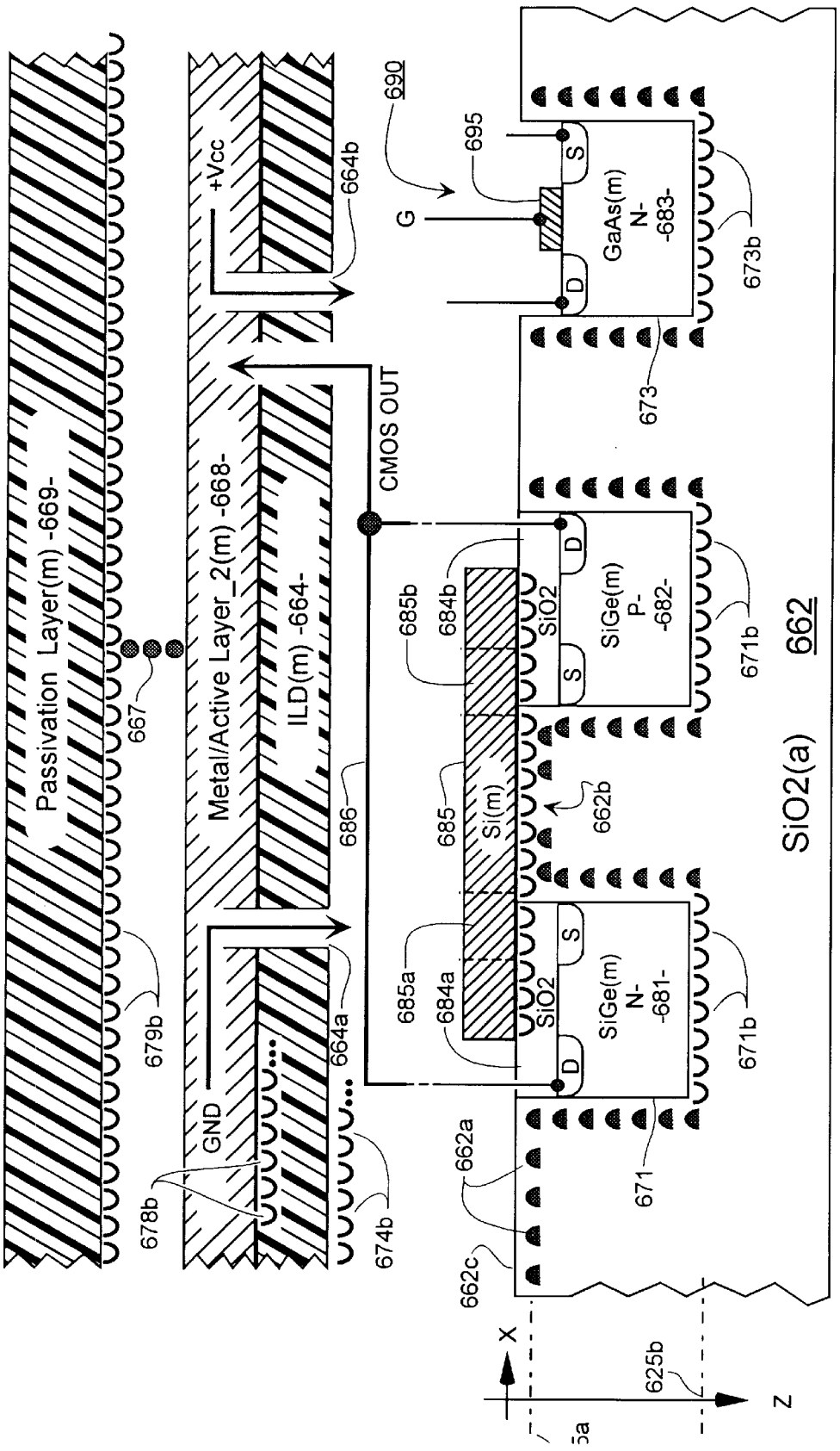
FIG. 6C is a cross-sectional view showing a third article of manufacture having single-crystal gate interconnect, single-crystal drain interconnect, a Schottky-gate field effect transistor with a III–V channel region and single-crystal ILD and passivation layers.

FIG. 6C is a cross-sectional view of an integrated circuit device 660 which may be implemented using the method of FIG. 6B. Integrated device 660 is a monolith which includes a bulk base layer 662 composed of an amorphous insulator such as $SiO_2$. Troughs 671, 672 and 673 are selectively etched into base layer 662 in spaced-apart relationship, as shown. A first, template-forming channelizing process (additive and/or subtractive) produces nucleation-friendly seeds 671b at the bottoms of trenches 671, 672 for preferentially encouraging growth of single-crystal silicon or a single-crystal silicon alloy (e.g., SiGe) from the bottoms of trenches 671, 672. A second template-forming channelizing process (additive and/or subtractive) produces nucleation-friendly seeds 673b at the bottom of trench 673 for preferentially encouraging growth of a single-crystal, other kind of semiconductor from the base of trench 673. The other kind of semiconductor may be a III–V compound such as GaAs.

The first single-crystal semiconductor compound (e.g., SiGe) is epitaxially grown respectively in trenches 671 and 672 to produce the illustrated respective fills, 681 and 682, each to a height slightly below top surface 662c of the bulk base 662. The difference in height is calculated to provide coplanarity after a later, thermal oxidation process that will form regions 684a, 684b.

The monocrystalline material 681 that fills first trench 671 is doped to have an N- bulk conductivity type (e.g., with phosphorous) while the monocrystalline material 682 in second trench 672 is selectively doped to have a P- type of bulk conductivity. Gate oxide layers 684a and 684b are then respectively and thermally grown on the monocrystalline fills 681, 682. This thermal oxidation process (or any other alternatively appropriate creation of gate oxide) should bring the height of the fills in trenches 671 and 672 to coplanarity with the top surface 662c of the bulk substrate 662. Otherwise, a planarization technique may be used as appropriate.

Another template-forming, channelized process is next carried out selectively and in accordance with the invention across the top coplanar surfaces (e.g., including 662c between 671, 672) of the bulk substrate 662 and the gate oxide layers 684a and 684b to create one or more monocrystal-seeding templates 662b disposed near and contrasted by nucleation-unfriendly surface areas such as 662a. The illustrated seeding template 662b has nucleation-friendly sites that are spaced-apart to encourage growth of a monocrystalline conductor or semiconductor.

In this example, the next, epitaxially-grown material 685 is single-crystal silicon. This next-grown monocrystalline material (Si) is patterned to define interconnected, gate electrodes as indicated in the figure by rectangular region 685. Openings such as 685a, 685b (denoted by dashed line pairs) are provided through the material of gate interconnect 685 for allowing source and drain implants and subsequent contact to the source and drain regions.

Next, self-aligned source (S) and drain (D) implants are made through openings 685a, 685b and through gate oxide regions 684a, 684b into the material fills 681, 682 as indicated by the S and D areas of the figure. P+ implants are made into fill 681 while N+ implants are made into fill 682. The material of interconnected, gate electrodes 685 is used as source/drain implant shield and is simultaneously doped to have an N+ or P+ conductivity as appropriate. After thermal processing, the source and drain doping implants diffuse outwardly to created the source (S) and drain (D) regions illustrated in FIG. 6C.

Contacts may be made to the source and drain regions, as for example, indicated by partially-dashed connection line 686 and its extensions which interconnect the drain (D) regions of fills 681 and 682 to one another to thereby define a CMOS output terminal. In one embodiment, interconnect 686 includes conductively-doped and monocrystalline semiconductor (e.g., Si(m)) that is grown coplanar to interconnect material 684 (but in another sectional plane other than that of FIG. 6C).

Inter-layer dielectric (ILD) material 664 may then be provided over the first gate/interconnect layer 685 (and optionally 686) for providing inter-layer insulation where desired.

A metallization or further active layer 668 is then formed on ILD layer 664. The N and P field effect transistors defined by 681, 682, 682a,b and 684 may define a high-speed CMOS amplifier where the respective source regions (S) of the N and P devices receive respective ground and +Vcc power from metallization in layer 668 through vias (e.g., 664a, 664b) formed in ILD layer 664.

Ellipses symbol 667 indicates that further ILD layers and active/metal layers may be formed above respective ILD layer 664 and metal/active layer 668 as desired. A topmost passivation layer 669, made of an appropriate insulating material, is then formed to hermetically seal the monolithic structure 660. In one embodiment, at least the topmost passivation layer 669 is constituted as a monocrystalline insulator (e.g., $SiO_2(m)$, $Si_3N_4(m)$, etc.) grown from a monocrystal-seeding template 679b of the invention. The advantages of such a single-crystal passivation layer 669 include: better hermetic sealing of the device 660 with fewer defects that might allow corrosive materials to attack internal elements of the integrated device 660. Also, the single-crystal structure of passivation layer 669 provides for better thermal conduction and heat dissipation from the monolithic device 660.

In the same or an alternate embodiment, one or more of the ILD's such as 664 are grown as single-crystal material from a corresponding monocrystal-seeding template 674b in accordance with the invention. The advantages of monocrystalline ILD's include the provision of higher breakdown voltage ($BV_{OX}$) as compared to amorphous ILD's. Additionally, monocrystalline ILD's tend to exhibit lower defect densities and higher values of thin film thermal conductivity. These characteristics assist in the formation of 3D IC's where removal of heat from multiple active layers (e.g., 681–683, 668) becomes a problem.

Further, one or more of the additional metal/active layers such as 668 may be single-crystal metal and/or semiconductor material that is grown from a corresponding one or more monocrystal-seeding templates (e.g., 678b) in accordance with the invention. Monocrystalline metal tends to have lower defect densities, lower sheet resistance, and better thermal conductivity than a polycrystalline or amorphous counterpart. Similarly, monocrystalline semiconductor in an active layer tends to have fewer defects and better electrical characteristics than a polycrystalline or amorphous counterpart.

Aside from forming high-speed MOSFET devices such as the SiGe(m) devices of isolated tubs 671 and 672 (where an '(m)' suffix denotes in FIG. 6c that the corresponding material is preferably monocrystalline), other kinds of devices such as MESFET or Schottky-gate field effect devices may be formed in the same monolith 660. For example, fill material 683 may be monocrystalline GaAs grown from a corresponding monocrystal-seeding template 673b in accordance with the invention. Amorphous or polycrystalline gold (Au) or platinum (Pt) or tungsten silicide ($WSi_2$) may be deposited on fill material 683 and patterned as shown to form a gate electrode 695 for the corresponding Schottky-gate FET 690. Such Schottky-gate FET's may be used for carrying out high-frequency functionalities extending into the microwave range.

Accordingly, it has been shown that different kinds of devices may be monolithically integrated into a multi-layer device 660 which, because of the various monocrystalline structures contained therein, provide higher frequency characteristics, better thermal dissipation characteristics and better corrosion resistance than counterpart devices formed with polycrystalline or amorphous materials.

FIG. 7 is a cross-sectional view showing a process 700 in which a substrate 720 having multiple layers of different materials is exposed to one or more channelized beams of nucleating or knock-off particles in accordance with the invention to thereby form a modified substrate 720' having a crystal-seeding template thereon or therein. The modified substrate 720' is thereafter subjected to epitaxial-like growth of single-crystal material in a process chamber 750 in accordance with the invention.

Although the examples of FIGS. 2A–6B provided simplified examples where the substrate was composed of a homogeneous material, it is fully within the contemplation of the invention to provide substrates such as 720 having many different kinds of materials arranged as stacked layers and/or as side-by-side surface components, and to grow single-crystal of a first order from otherwise-ordered surfaces of one or more of the materials on substrate 720.

Accordingly, in the example of FIG. 7, substrate 720 (before formation of the seeding template(s) through use of channelizing mask 740a) includes a first layer 721 composed of a first electrically insulating material such as, for example, $Si_{x1}O_{y1}N_{z1}$, where the compound fractional value x1 is greater than zero and at least one of the other compound fractional values, y1, z1, is also greater than zero. A first semiconductor layer 722 is disposed on first insulator layer 721 and composed of any one of amorphous, polycrystalline, or monocrystalline semiconductor compositions such as, for example, $Si_{x2}Ge_{y2}$, GaAs, etc. In the formula $Si_{x2}Ge_{y2}$, the compound fractional value y2 is less than about 5% while x2 defines essentially the remainder of 100%. If the first semiconductor layer 722 is single-crystal, that layer 722 could have been previously grown on insulator layer 721 in accordance with the invention. Portion 721a of the INSULATOR_1 layer is accordingly shown to have a surface that is nucleation-friendly and ordered to serve as a seeding template for growth of the overlying SEMICONDUCTOR_1 layer 722. SEMICONDUCTOR_1 would have been grown by a first round of channelized implant (or knock-off) and epitaxial-like growth.

An exposed, second surface portion 721b of the INSULATOR_1 layer remains nucleation-unfriendly to the material that will be next grown in process chamber 750.

A first organic material layer 723 is further disposed on insulator layer 721. In general, the ORGANIC__1 layer 723 should be deposited last, after other portions of substrate 720 are formed. ORGANIC__1 layer 723 may be patterned by micro-lithography techniques for example, to obtain its illustrated cross-sectional form. The material of ORGANIC__1 layer 723 can be any carbon-containing compound such as one having the general form $C_{x3}H_{y3}R_{z3}$, where at least the compound fraction value x3 is greater than zero and at least one of the compound value fractions, y3, z3, is greater than zero and further where R represents an appropriate moiety attached to the carbon chain. As indicated, the exposed top surface of ORGANIC__1 layer 723 is nucleation-unfriendly to the single-crystal material that will be next grown in process chamber 750.

A second insulator layer 724 is disposed on semiconductor layer 722. The INSULATOR__2 material of layer 724 can be entirely different from that of first layer 721 or the same. In one example it may have the general form $Si_{x4}O_{y4}N_{z4}$. Again, as seen, layer 724 has an exposed top surface that is nucleation-unfriendly to the single-crystal material that will be next grown in process chamber 750.

Disposed adjacent to insulator layer 724 and on top of semiconductor layer 722 is a metal layer 725 which may be composed of any convenient metal such as Al, AlCu, Cu, Ti, W, TiW, etc. The exposed top surface of this metal layer is also indicated to be nucleation-unfriendly to the next-to-be-grown material (and if not it can be so modified to be as is explained for item 726).

The top surface of the first semiconductor layer 722 is nucleation-friendly to the next-to-be-grown material, but only in a randomized fashion. In other words, conventional growth of the next material on top of the material of layer 722 would produce an amorphous version of the next-to-be-grown material because layer 722 does not have crystal lattice constants equal to or growth-wise, close to those of the next-to-be-grown material. However, in accordance with the invention, one or more contrasting monolayers 726 of nucleation-unfriendly atoms may be deposited or other wise formed on top of the SEMICONDUCTOR__1 722 so that the randomly organized nucleation-friendly sites of layer 722 are covered prior to formation a nucleation-seeding template using mask 740a. Alternatively, if the semiconductor material of layer 722 is easily oxidizable, a thin layer of thermally-grown oxide may be formed at the position of 726.

The illustrated non-rectangular block 727 is composed of yet another nucleation-unfriendly material and is shown to partially cover portions of both semiconductor layer 722 and insulator layer 721. Block 727 may be a sacrificial mask which is to be later removed prior to movement of the channelized substrate 720' into process chamber 750.

A thin channelizing mask 740a having a thickness of about 7 μm (7 microns) to about 12 μm is provided on a thicker support structure 740. Support structure 740 is preferably made of a same single-crystal material as that of channelizing mask 740a and preferably has a much greater thickness of, for example, 2 mm (2 millimeters) to 4 mm. The crystal orientation of channelizing mask 740a may be completely different from that of the SEMICONDUCTOR__1 layer 722. The lattice constants of channelizing mask 740a may also be completely different from those of the SEMICONDUCTOR__1 layer 722 (if 722 is monocrystalline), which is why the top surface of layer 722 may represent a randomized rather than orderly, nucleation surface for the next-to-be-grown single-crystal material.

As with the previous examples, beams 760 of either nucleation-friendly particles or knock-off particles are fired through channelizing mask 740a to create a desired nucleation-friendly template having the lattice organization of mask 740a. The template is projected onto the exposed surfaces of the underlying substrate 720 by beams 760 that pass through the channels of mask 740a.

Following the channelized template-forming step, the now altered substrate 720' is introduced into an epitaxial growth process chamber 750 which, for example, could be a low-temperature CVD chamber such as disclosed in U.S. Pat. No. 5,472,508. Alternatively, process chamber 750 may use a room temperature wet epitaxial process or an electrolytic or electroless plating process. Control unit 755 controls the epitaxial growth parameters of chamber 750, including temperature, time of growth, chamber pressure, selection of reagents, etc.

It should be apparent that the process temperature used in chamber 750 and the length of the epitaxial-like growth process should not exceed the thermal budget of the substrate 720'. For example, if the ORGANIC__1 layer 723 will melt or vaporize at temperatures above 450° C., then the growth process used within chamber 750 should not exceed this temperature limit. Molecular beam epitaxy (MBE) or electrolytic or electroless plating may be used in lieu of CVD epitaxy to grow the next-desired single-crystal material. This would be the case, for example, when layer 723 is a polymer-based, low dielectric constant insulator that is used to electrically insulate the next-grown material.

If desired, the channelized template-forming step and the subsequent epitaxial growth step may be both carried out in a same process chamber (e.g., 750). Also, in alternate embodiments, any of the low temperature layers of substrate 720 may be omitted to thereby increase the temperature that can be safely used in the epitaxial growth process of chamber 750.

Figure 8A:
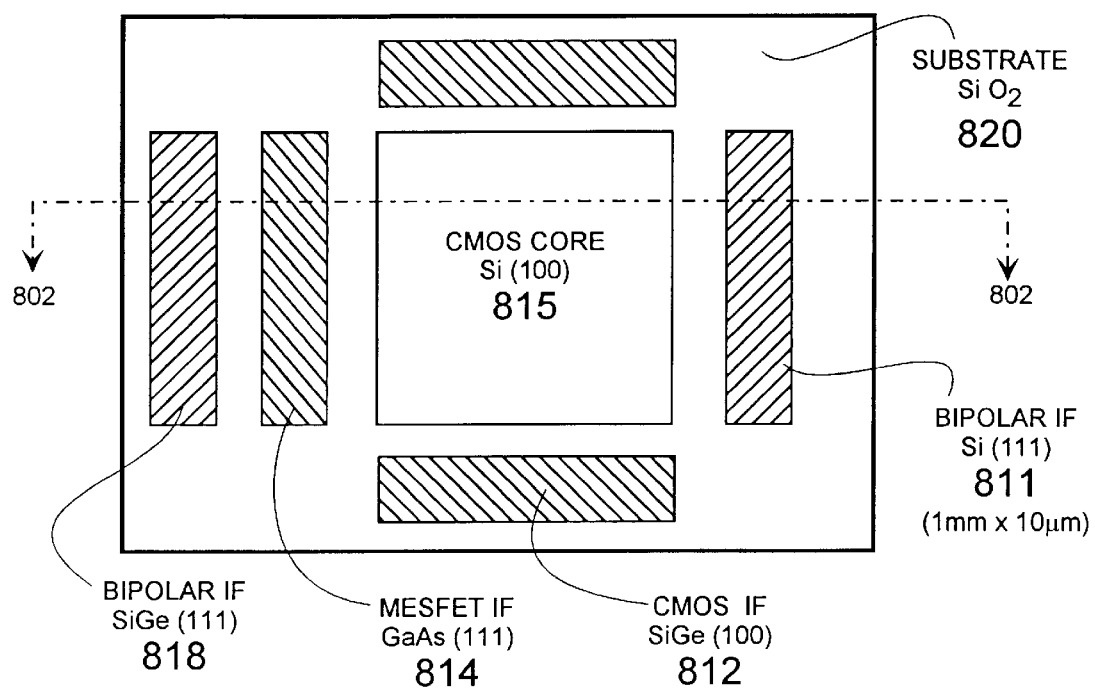
FIG. 8A is a top plan view showing a fourth article of manufacture having plural single-crystal regions of different crystal orientations grown in accordance with the invention.

Referring to FIG. 8A, a cross-sectional top view is shown of an active layer 800 of an integrated circuit chip in accordance with the invention. A 3-dimensional (3D) approach may taken in the chip where the chip comprises many active layers such 800, stacked one above the next and separated by appropriate insulating layers. The illustrated active layer 800 includes a silicon dioxide or other isolation fill that extends up from an underlying silicon dioxide or other underlying isolation layer 820. Embedded within this isolating fill is a first rectangular, semiconductor region 811 composed for example of monocrystalline silicon having a (111) orientation. Interface circuitry formed with bipolar transistor technology is defined within the first semiconductor region 811. Rectangular region 811 may have dimensions such as, for example, 1 mm by 10 μm. Other shapes, positions and sizes for region 811 are also within the contemplation of the invention. For example, region 811 may alternatively be triangle-shaped and fitted by a corner of the illustrated rectangular IC die.

Another rectangular semiconductor region 812 is further disposed in the active layer 800, spaced-apart from but co-planar with 811, and composed for example of monocrystalline SiGe having a (100) crystal orientation. This region 812 may be used for implementing CMOS (complementary metal-oxide-semiconductor) interface circuitry. As is understood in the art, CMOS circuitry is preferably implemented on a (100) oriented cubic crystal while bipolar circuitry, such as that of region 811, is preferably implemented on a (111) oriented cubic crystal. The present invention allows both (100) oriented and (111)

oriented single-crystal material to be simultaneously grown in a same active layer if such is desired. Simultaneous growth can reduce fabrication time and costs. This is highly desirable in the semiconductor fabrication industry.

A third rectangular semiconductor region 814 having dimensions similar to those of illustrated 811 and 812 is further provided in the active layer 800, spaced-apart from but co-planar with regions 811 and 812, and composed for example of monocrystalline GaAs having a crystal orientation of (111). This section 814 may be used for implementing high speed MESFET devices (Metal Semiconductor Field Effect Transistor). Examples of MESFET devices with different gate materials were provided above with respect to item 690 of FIG. 6C.

A fourth, square-shaped region 815 is disposed between and spaced-apart from regions 811, 812 and 814. Region 815 is composed of monocrystalline silicon having (100) crystal orientation and implementing a CMOS core circuit. The dimensions of region 815 may be 1 mm by 1 mm. Other shapes, positions and sizes for core region 815 are also within the contemplation of the invention. For example, region 815 may alternatively be hexagonal in shape and have 6 interface trapezoids provided adjacent to its sides.

A fifth rectangular region 818 is provided near an edge of the active layer 800 and is composed of monocrystalline SiGe having a (111) crystal orientation. Region 818 may be used for implementing further bipolar interface circuitry.

All of the monocrystalline semiconductor regions 811, 812, 814, 815, 818 may be grown using the channelized template-forming techniques of the present invention (using one or more template-forming implants/knock-offs). It is understood that above the illustrated active layer 800, an insulating layer may be provided with interconnect vias extending therethrough to layer 800. Above this insulating layer (not shown), one or more metallization layers may be provided for interconnecting the various circuits implemented in monocrystalline regions 811, 812, 814, 815 and 818.

Although not explicitly shown, regions of the active layer 800 may further include ones composed of single-crystal optical or electro-optical materials as appropriate for carrying out optical and/or electro-optical functions either in isolation or in cooperation with the described electronic regions. Additional regions of active layer may include ones composed of single-crystal ultrasound materials for carrying out ultrasonic functions (e.g., SAW filtering) that again function either in isolation or in cooperation with the other regions. The list of possibilities is almost endless.

Figure 8B:
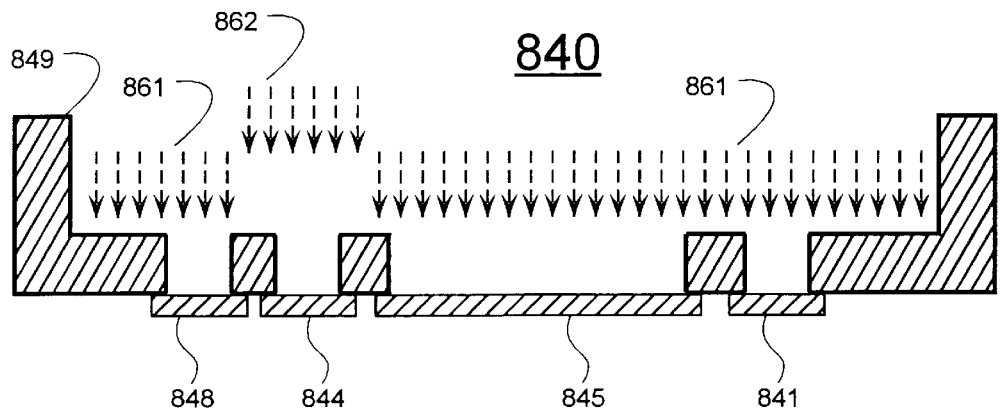
FIG. 8B is a cross-sectional view of a mask support structure having plural single-crystal, channelizing masks, each of a respective crystal orientation for producing the structure of FIG. 8A.

Cross-section indicating line 802—802 in FIG. 8A corresponds to the view shown in FIG. 8B. FIG. 8B shows a cross-sectional side view of a channelizing mask structure 840 that may be used for simultaneously defining the channelized seeding-templates upon which two or more of the monocrystalline regions 811, 812, 814, 815 and 818 are grown. Mask structure 840 has a thick and mechanically strong base portion 849 that is preferably composed of a material having the same or similar coefficients of thermal expansion as do its plurality of attached, but thinner channelizing masks, 841, 845, 844 and 848. In one embodiment each of the channelizing masks 841–848 has a thickness in the range 7 $\mu$m–12 $\mu$m while support structure 849 has a thickness in the range 2 mm–4 mm. As should be evident from line 802—802, channelizing mask 841 is used for forming the seeding template of monocrystalline semiconductor region 811. Mask 845 corresponds to region 815. Mask 844 corresponds to region 814. And mask 848 corresponds to region 818.

Channelizing masks 841–848 may be thermally bonded to the support structure 849. In one process, the pre-bonded composite structure 840 is placed face-down as shown on a planar support within a high temperature chamber and heated to 300° C. in the presence of a $O_2$ ambient. An electrical charge of approximately 600V is applied across the interfaces of the to-be-bonded elements for approximately 2–5 seconds. Oxidized bonding is thereby encouraged at the interfaces. Other bonding processes may be used as appropriate.

Alternatively, some of the channelizing masks and the support structure 849 may be made of the same material and have the same crystal orientation. The thinner channelizing masks may be formed by selectively etching back part of the thicker support structure 849.

During the process of creating monocrystal seeding-templates, a first nucleating species such as 861 may be passed through the thinner channelizing masks 841, 845 and 848 to form the silicon-based templates for regions 811, 815 and 818. Channelizing mask 844 is blocked off (with an appropriate mask, not shown) at this time because it uses a different nucleating species 862 for forming the gallium-based seeding-template corresponding region 814. Second nucleating species 862 may be passed through structure 840 at another time when masks 841, 845 and 848 are blocked off (with another appropriate mask, not shown).

As should be apparent from the combination of FIGS. 8A and 8B, the crystal orientation, size and shape of channelizing mask 841 may be different from that of channelizing mask 845. Nonetheless, both of masks 841 and 845 may be used simultaneously with a same nucleating species 861 to create the differently-oriented single-crystal regions 811, 815. Many variations on this theme may be carried out as desired.

The above examples for explaining the additive and subtractive processes (FIGS. 2A, 3A) are directed to providing epitaxial-like growth of monocrystalline Si on an insulative, non-single-crystal substrate composed for example of oxides of silicon, nitrides of silicon or oxinitride of silicon. However, the invention is not limited to just materials that are useful in the semi-conductor-based microelectronics industry. The principles of the invention may be applied to many industries as indicated by Table 1.0. In Table 1.0, the parenthetical notation: '(a)' indicates an amorphous or non-single-crystal organization while '(m)' indicates a monocrystalline organization for each respectively qualified material. Further in Table 1.0, '(+)' indicates a material that may be used in the additive process of FIGS. 2A–2C while '(−)' indicates a material which may be used in the subtractive process FIGS. 3A–3C. If no such designation is provided, the material is understood to be useful for both the additive and subtractive processes.

Referring to examples S3 and S4 in the 'semiconductor' section of Table 1.0, note that the material of the channelizing mask does not have to be the same as that of the single crystal that is to be grown from the seeding template formed by the channelizing process. For example, Ge (example S4) has a lattice constant of 5.66 Å. AlAs has essentially the same lattice constant. The zinc blende configuration of monocrystalline AlAs may be viewed as alternate monolayers of aluminum and arsenic. Accordingly, either one of aluminum or arsenic may be used as a nucleating species for seeding the zinc blende growth of AlAs while Ge serves as the channelizing mask. This configuration may also be flipped around where AlAs serves as the channelizing mask and Ge is the single-crystal material that is to be grown.

A channelized template may also be used to seed strained-layer growth. In example S3 of Table 1.0, silicon has a lattice constant of 5.43 Å while GaP has a slightly different lattice constant of 5.45 Å. Either may serve as the channelizing mask for strained growing the other. Others of the examples provided in Table 1.0 should be self-explanatory.

TABLE 1.0

| Industry/ Example No. | Substrate (20,30) | Mask (40,340) | Nucleating/ Knock-off particles | Crystal to be Grown |
|---|---|---|---|---|
| Semi- conductor (Ex. S1) | $SiO_2$(a,m), $Si_3N_4$(a), $Si_xO_yN_z$(a) | Si(m) | Si(+) Ge(+) Ar(−) He(−) | Si(m) |
| (Ex. S2) | $SiO_2$(a,m), $Si_3N_4$(a), $Si_xO_yN_z$(a) | Ge(m) | Si(+) Ge(+) Ar(−) He(−) | Ge(m) |
| (Ex. S3) | $SiO_2$(a,m), $Si_3N_4$(a), $Si_xO_yN_z$(a) | Si(m) a1 = 5.43Å | Ga(+) P(+) Al(+) | GaP(m) = 5.45Å AlP(m) = 5.46Å |
| (Ex. S4) | $SiO_2$(a,m), $Si_3N_4$(a), $Si_xO_yN_z$(a) | Ge(m) a1 = 5.66Å | Ga(+) As(+) Al(+) Zn(+) Se(+) | GaAs(m) = 5.65Å; AlAs(m) = 5.66Å; ZnSe(m) = 5.67Å |
| (Ex. S5) | $SiO_2$ (m) {Quartz} | Diamond {C(m)} | C(+) | C(m) |
| (Ex. S6) | $SiO_2$(a,m), $Si_3N_4$(a), $Si_xO_yN_z$(a) | GaAs(m), GaP, other III- IV(m), II-VI(m) | Ga(+), As(+), P(+) | GaAs(m), GaP(m), GaAlAs(m), other III- IV(m), II-VI(m) |
| (Ex. S7) | $SiO_2$(a,m), $Si_3N_4$(a), $Si_xO_yN_z$(a) | Cu(m), Al(m), other methal (m) | Cu(+), Al(+)m other metal(+) | Cu(m), Al(m), other metal (m) |
| (Ex. S8) | Diamond {C(a,m)} | Cu(m), Al(m), other metal(m), semicon- ductor | Cu(+), Al(+), other metal(+), semicon- ductor | Cu(m), Al(m), other metal(m), semicon- ductor(m) |
| (Ex. S9) | $SiO_2$(a), $Si_3N_4$(a), $Si_xO_yN_z$(a) | $SiO_2$(m) | Si(+) | $SiO_2$(m) {Quartz} |
| Optical/ (Ex. O1) | $SiO_2$(a,m), $Si_3N_4$(a), $Si_xO_yN_z$(a) | $SiO_2$(m) {Quartz}, $Al_2O_3$(m), $SnO_2$(m) | Si(+), Ar(−), Sn(+) | $SiO_2$(m) {Quartz} $Al_2O_3$(m), $SnO_2$(m) |
| Tribology/ (Ex. T1) | Steel(a,m), other metal(a,m) | $SnO_2$(m) | Sn(+) | $SnO_2$(m) |
| Plastics/ (Ex. P1) | Organic $\{C_xH_yR_z$(a,m)$\}$ | Cu(m), Al(m), other metal(m) | Cu(+), Al(+), other metal(+) | Cu(m), Al(m), other metal(m) |
| Metallurgy (Ex. M1) | Metal {Fe, Ni, Co, Ti, W, TiW, Ta, Hf, Zr, etc.} | Diamond {C(m)} | C(+) | Diamond {C(m)} |
| (Ex. M2) | Metal | $SnO_2$(m) | Sn(+) | $SnO_2$(m) |
| (Ex. M3) | Metal_1 | Metal_2 (m) | Metal_2 (+) | Metal_2 (m) |
| General (Ex. G1) | Any contrasting material | $Al_2O_3$(m), $SnO_2$(m), SiC(m), TiN(m)), | Al(+), Sn(+), O(+), C(+), | $Al_2O_3$(m), $SnO_2$(m), SiC(m), TiN(m), |

TABLE 1.0-continued

| Industry/ Example No. | Substrate (20,30) | Mask (40,340) | Nucleating/ Knock-off parti- cles | Crystal to be Grown |
|---|---|---|---|---|
| | | Ti(m), TiW(m), Zr(m), Hf(m) | N(+), Ti(+), W(+), Zr(+), Hf(+) | Ti(m), TiW(m), Zr(m), Hf(m) |

Note in example S5 that high-temperature quartz forms the support layer for forming a diamond layer above. Many of the currently-available methods for growing thin film diamond call for high temperature above the melting point of ordinary glass. When techniques become available for growing thin film diamond at temperatures below the melting point of ordinary glass (amorphous $SiO_2$), the present invention may be used for coating such glass surfaces and other lower-melting point materials with scratch-resistant diamond film. In the semiconductor industry, diamond is useful for its excellent thermal conduction and electric isolating properties. The diamond grown in example S5 may become the substrate for later example S8.

The energies and doses to be used for the template-forming accelerated species of each example can vary depending on the intended applications. In one embodiment, an additive beam consists essentially of $Si^{28}$ isotope ions which have energies in the range of about 20 KeV–25 KeV and a dosage density of about $10^{14}$ to $10^{16}$ atoms/cm$^2$. The rp depth for such an implant $SiO_2$ at normal incidence, is about 220 Å to 270 Å. Prior to single-crystal growth, the density of surface-exposed nucleating particles can be varied as desired by appropriate etching-back of the surface with processes such as reactive ion etching (RIE).

In a subtractive template-forming process of the invention, the particle beam may consist essentially of $Ar^{40}$ isotope ions projected with energies in the range of 20 KeV to 25 KeV and a dosage density of about $10^{14}$ to $10^{16}$ ions/cm$^2$ or less. The expected $r_p$ for this subtractive process should be about 180 Å–240 Å. In an alternate embodiment of the subtractive process, the knock-off particle beams consist essentially of $F^{19}$ isotope ions provided with about the same energy and dosage.

Subsequent epitaxial growth may be carried out with an appropriate dry or wet epitaxial growth method. For epitaxial growth of monocrystalline silicon, a CVD process may be used wherein the reaction gases can be any one of $SiCl_4$, $SiHCl_3$, $SiH_2$, $Cl_2$, or $SiH_4$ in a $H_2$ carrier.

The channelizing mask and substrate may be used within a X–Y stepper such as used in the semiconductor industry for lithographically defining individual dice or reticles with each step of the equipment. With each additive or subtractive burst of template-forming particles, the channelizing mask 'prints' its respective anti-shadow image into the underlying reticle area. The subsequent epitaxial-like growth process uses the stepper-produced templates to simultaneously grow single-crystal material from each exposed seeding template of the processed wafer.

The invention is not limited to small area substrates. Large area substrates may also be so processed. In such a case, the channelizing mask may be held within a stepping platform while the substrate remains still. Examples of large area application include large area solar cells wherein highly-efficient monocrystalline layers are grown on relatively inexpensive glass substrates to provide high quality PN junctions for capturing charge carriers generated by solar energy. Also, large area flat panel, liquid crystal displays (LCD's) or other kinds of large area, flat-panel television displays may be produced wherein traditional, polycrystalline TFT circuits are replaced with superior monocrystalline circuits.

In yet another application, the present invention may be used for growing single-crystal layers of high temperature superconductor materials on insulating layers such as quartz or amorphous glass, or the like. Combinations of high $T_c$ superconductor films may be provided on the same substrate that supports monocrystalline silicon transistors, monocrystalline solar cells and/or monocrystalline flat panel display elements to thereby provide a highly integrated and economical combination of such devices. The high $T_c$ superconductor films may be used for providing electrical interconnect between the other elements.

High quality monocrystalline metal interconnects may also be grown in accordance with the invention. For example, refractory metals such as tungsten (W) and tungsten silicide ($WSi_2$) which have relatively high melting points above about 700° C. to 850° C. may be provided with appropriate barrier metals so that 3D circuits may be fabricated with Si epitaxy methods that require temperatures of about 700° C.–850° C. for each of the multiple, active layers of the 3D IC. When lower temperature metals such as aluminum and Al based alloys (AlCu) are used for interconnect, subsequently-formed semiconductor layers need to be grown with a low temperature epitaxy process not exceeding a limit of approximately 450° C. For example, molecular beam epitaxy (MBE) or electrolytic or electroless plating may be used in lieu of higher temperature CVD epitaxy to grow single-crystal films within an integrated circuit structure after one or more non-refractory metal layers have been deposited or after a low temperature insulating layer has been introduced into the structure (e.g., a low dielectric constant polymer-based, inter-layer dielectric (ILD)).

In the case where ILD's are used, the projected depth of the seeding-template should be set approximately equal to the thickness of the monocrystalline film that is to be grown and embedded within the ILD layer. After the template-forming process, areas of the ILD where semiconductor material is to be grown are selectively etched away to the depth of the template plane. Then the monocrystalline material is epitaxially grown up to the surface height of the ILD. This technique may be used to either eliminate planarization steps, or at least reduce the time and cost of such planarization steps. Also, with such selective growth of monocrystalline material only in the isolated regions where needed, substantial savings can be realized in the amount of materials used for forming spaced-apart monocrystalline regions. Prior techniques where so-called field oxide was thermally grown into monocrystalline substrate in order to provide isolation were wasteful of the monocrystalline substance.

The present invention enables economic realization of Ultra Large Scale Integrated Circuits (ULSIC's) having one or both of a very large surface area per active layer or multiple ones of smaller active layers stacked one above the other in 3D fashion. The invention permits production of high-performance (CMOS) devices that use monocrystalline SiGe films for their active layers and suitable amorphous and/or non-single-crystal insulating layers between active layers. Various, high frequency III–IV or II–VI semiconductor compounds such as GaAs may be utilized for fabricating high-performance MESFET (Metal Semiconductor Field Effect Transistor), HEMT (High Electron Mobility Transistor) and even optical devices within the same or another integrated monolith. The crystal orientation of each monocrystalline region may be appropriately controlled by using correspondingly-oriented materials in the channelizing mask. Monolithic devices which incorporate transistors made from different semiconductors (e.g., Si, GaAs, etc.) are sometimes referred to as Ultra-Performance Integrated Circuits (UPIC's).

While the above description has focused on: (1) additive implant of a nucleation-friendly species through a channelizing mask into a nucleation-unfriendly substrate layer and/or (2) subtractive firing of a removing species through a channelizing mask to a substrate layer that has both nucleation-unfriendly species and nucleation-friendly species for the purpose of removing the nucleation-unfriendly species from sites spaced-apart according to a desired lattice constant and thereby exposing nucleation-friendly species at such spaced-apart sites; it is further within the contemplation here to: (3) fire nucleation-unfriendly species (e.g., oxygen, nitrogen) through a monocrystalline channelizing mask into an amorphous or polycrystalline substrate layer composed of nucleation-friendly species (e.g., silicon, metal) for the purpose of creating spaced-apart sites of nucleation-unfriendly material embedded in a contrasting background of nucleation-friendly material. Yet another variation is to: (4) fire nucleation-unfriendly species (e.g., oxygen, nitrogen) through an ordinary blocking mask having large openings therein (as opposed to atomic channels) into a preformed, monocrystal seeding-template (e.g., one implanted for encouraging growth of single-crystal copper), where the seeding-template is on or within an amorphous or polycrystalline substrate layer composed of nucleation-unfriendly species (e.g., a silicon oxide, a metal oxide) for the purpose of defining a wiring or other pattern by selectively destroying parts of the preformed, monocrystal seeding-template.

In one example, nitrogen is fired through a monocrystalline channelizing mask consisting of silicon into an amorphous or polycrystalline substrate layer composed of silicon. This produces spaced-apart sites of nucleation-unfriendly material (silicon nitride) where the spacing (N×a1) corresponds to the lattice constant of silicon. It thereby creates, adjacent, spaced-apart sites of nucleation-friendly silicon that have not been so altered. Of course, the firing of the nitrogen atoms through the silicon channelizing mask will tend to degrade the channelizing mask because those nitrogen atoms that do not pass through the channels in the channelizing direction will typically become embedded in the mask itself and create defect sites in the mask. To counter this (and even the general amorphization that may occur if silicon atoms are instead fired through a silicon mask {into a silicon dioxide substrate for example}, the channelizing mask should be periodically recrystallized by thermal annealing so as to remove defects that are created over time by the firing of one or more species through the mask in accordance with any of the above described procedures. Eventually, if the monocrystallinity of the channelizing mask deteriorates too much, the mask should be replaced with a fresh one. It is desirable from an economic standpoint to be able to use one channelizing mask for plural wafers rather than having to discard channelizing masks on a one-for-one basis with processed wafers.

As an example of the fourth process of firing nucleation-unfriendly species through a regular mask (not a channelizing mask) into a preformed, monocrystal seeding-template, consider the case where a channelizing mask consisting of monocrystalline metal such as copper (Cu) has been used to implant metal (e.g., Cu) atoms into an amorphous substrate layer composed of a nucleation-unfriendly species, say $Si_3N_4$. Next, a regular mask with lithographically-defined openings is brought over the substrate and the species fired through the regular mask is oxygen and/or nitrogen. This creates spaced-apart regions of nucleation-unfriendly sites of metal oxide or metal nitride in the amorphous substrate. Epitaxial-like growth of further metal from what is left of the monocrystal seeding-template begins to produce monocrystalline metal atop the amorphous substrate layer only in places where the monocrystal seeding-template has not been destroyed or overwritten by the oxygen/nitrogen implant. A predefined wiring pattern made of copper can then be created without having to selectively etch through the copper (the latter being a difficult process). Thus, low resistance and good quality metal interconnect can be created having monocrystalline metal as its material.

The above disclosure is to be taken as illustrative of the invention, not as limiting its scope or spirit. Numerous modifications and variations will become apparent to those skilled in the art after studying the above disclosure.

By way of example, both the additive and subtractive template-forming operations can be carried through a same channelizing mask for a same substrate. The subtractive beam would print a first template of nucleation-friendly sites, by for example removing nucleation-unfriendly oxygen or nitrogen atoms from an SiON layer. The additive beam would print a second, superposing template of nucleation-friendly particles into the same spaced-apart sites as long as the mask and substrate are held in the same alignment.

Given the above disclosure of general concepts and specific embodiments, the scope of protection sought is to be defined by the claims appended hereto.

What is claimed is:

1. A method for preparing a substrate for encouraging growth therefrom of a single crystal of a first material and growth therefrom of a single crystal of a second material, where the substrate includes a region of third material, said third material being comparatively unfriendly to attachment thereto by particles of said first and said second materials, the method comprising the steps of:

creating in said third material region, a first set of spaced-apart nucleation-friendly sites whose apart spacings correspond to whole number multiples of respective lattice constants of a single crystal of said first material, and thereby substantially define a first growth template for preferentially seeding growth of said single crystal of said first material, where each nucleation-friendly site in said first set is defined by one or more particles of a fourth material to which said particles of the first material attach more preferentially than to particles of said third, nucleation-unfriendly material; and creating in said third material region, a second set of spaced-apart nucleation-friendly sites whose apart spacings correspond to whole number multiples of respective lattice constants of a single crystal of said first material, and thereby substantially define a second growth template for preferentially seeding growth of the single crystal of said second material, where each nucleation-friendly site in said second set is defined by one or more particles of a fifth material to which said particles of the second material attach more preferentially than to particles of said third, nucleation-unfriendly material wherein said single crystal of the first material differs from said single crystal of the second material at least in one of crystal orientation and chemical composition.

2. The method of claim 1 wherein at least one of said steps of creating nucleation-friendly sites includes:

additively implanting through a channelizing mask nucleation-encouraging particles to which said nucleation-encouraging particles, particles of the first or second material attach more preferentially than to particles of said third, nucleation-unfriendly material.

3. The method of claim 1 wherein at least one of said steps of creating nucleation-friendly sites includes:

providing through a channelizing mask one or more bombarding species for removing nucleation-blocking particles from said third material region of the substrate to thereby expose other particles of the substrate that define nucleation-friendly sites.

4. A Single Crystal on Arrayed Nucleation Sites (SCANS) method for growing different single crystal materials from a substrate composed of a material that is comparatively unfriendly to attachment thereto by particles of said to-be-grown single crystal materials, where said to-be-grown single crystal materials differ from one another at least in one of crystal orientation and chemical composition, said SCANS method comprising the steps of:

(a) providing plural channelizing masks each composed of a respective single crystal material having a respective crystal orientation and chemical composition;

(b) interposing the channelizing masks between the substrate and an ion beam source in an aligned manner such that a channeling direction of each interposed mask is essentially parallel to ion beams produced by said ion beam source;

(c) choosing ions of the ion beams to respectively consist essentially of an additive or subtractive species that will create arrayed, nucleation-friendly sites in the substrate after passage through a respective, interposed channelizing mask and after subsequently striking of the substrate, where each to-be-created, nucleation-friendly site is defined by one or more particles of to which said particles of a to-be-grown single crystal attach more preferentially than to said nucleation-unfriendly substrate and where said arrayed nucleation-friendly sites define lattice-matching, spaced-apart nucleation sites for encouraging subsequent epitaxial growth of a to-be-grown single crystal material from said arrayed, nucleation-friendly sites; and (d) firing the chosen ions through respective ones of the interposed channelizing masks for striking the substrate;

(e) growing from the arrayed, nucleation-friendly sites created in the substrate by said firing, respective ones of said different single crystal materials.

5. A SCANS method as set forth in claim 4, wherein the said single crystal materials are grown from corresponding, arrayed affinity sites defined in or on amorphous insulating materials and said single crystal materials are used for defining one or more of CMOS structures, bipolar transistors, MESFET transistor structures, HEMT transistor structures, gate electrodes and interconnects.

6. A SCANS method as set forth in claim 4, wherein the said single crystal materials are grown on arrayed affinity sites on amorphous materials provide a stacked plurality of substrates so as to provide each stacked substrate with a combination of a single crystal film and an oxide layer, thereby allowing the fabrication of semiconductor devices in three dimensions for creating monolithic 3D-ICs.

7. A SCANS method as set forth in claim 4, wherein said substrate includes a $SiO_2$ layer on which said parts of single-crystal mass are grown.

8. A SCANS method as set forth in claim 4, and further comprising the step of cooling at least one said channelizing mask to approximately the temperature of liquid nitrogen to thereby inhibit amorphization of the channelizing mask.

9. A SCANS method as set forth in claim 4, wherein the substrate includes $SiO_2$ and the nucleation-friendly implant material includes silicon.

10. A SCANS method as set forth in claim 4, wherein the substrate includes $Si_3N_4$.

11. A SCANS method as set forth in claim 4, wherein at least one of said arrayed, nucleation-friendly sites has a (100) crystal orientation.

12. A SCANS method as set forth in claim 4, wherein the substrate includes recessed regions in which said single crystal materials can be selectively grown to respective thicknesses
so that the surfaces of the grown single crystal materials are coplanar with a nonrecessed major surface of said substrate.

13. A SCANS method as set forth in claim 4, wherein at least one of said different single crystal materials is a single crystal Si film deposited on oxide so as to be patternable to form at least one of transistor gates and local interconnects.

14. A SCANS method as set forth in claim 4, wherein the different single crystal materials include (100) oriented and (111) oriented Si films.

15. A SCANS method as set forth in claim 4, wherein the different single crystal materials include SiGe films, with respectively controlled and varying concentrations of Ge for defining on said substrate both CMOS and bipolar devices.

16. A SCANS method as set forth in claim 4, wherein the different single crystal materials include films of carbon containing alloys of Si and SiGe.

17. A SCANS method as set forth in claim 4, wherein the different single crystal materials include single crystal, insulator films grown to define one or more of inter-layer dielectric (ILD) layers and passivation layers.

18. A SCANS method as set forth in claim 4, wherein the different single crystal materials include single crystal conductor films grown to define multilevel interconnects in an integrated circuit.

19. A SCANS method as set forth in claim 4, wherein the substrate includes glass that is configured for forming flat panel displays for computers and television monitors.

20. A SCANS method as set forth in claim 4, wherein at least one grown one of said different single crystal materials defines monocrystalline optical waveguides provided
on dielectric surfaces having refractive indices that are different than that of the grown at least one single crystal material.

21. A SCANS method as set forth in claim 4, wherein at least one grown one of said different single crystal materials defines a high $T_c$ superconductor.

22. A SCANS method as set forth in claim 4, wherein the substrate defines at least one of machine tools and shafts composed in bulk of amorphous materials, and where at least one of said different single crystal materials defines an outer coating for providing wear resistance.

23. A subtractive method for preparing a substrate for encouraging growth therefrom of a single crystal of a first material, where the substrate includes at least a region of a nucleation-unfriendly second material, said second material being comparatively unfriendly to attachment thereto by particles of said first material, and where for said substrate, at least one of the following conditions holds:

(0.1) said second material is subtractively convertible into a nucleation-friendly third material to which said particles of the first material attach more preferentially than to particles of said second, nucleation-unfriendly material; and (0.2) said second material overlies a region of fourth material, where said fourth material is nucleation-friendly, the method comprising the steps of:

(a) creating from said second material region, a set of spaced-apart nucleation-friendly sites whose apart spacings correspond to whole number multiples of respective lattice constants of a single crystal of said first material, and thereby substantially define a growth template for preferentially seeding growth of said single crystal of said first material, where each nucleation-friendly site in said first set is defined by one or more particles of one of said third and fourth materials to which said particles of the first material attach more preferentially than to particles of said second, nucleation-unfriendly material;

(a.1) wherein said step of creating includes providing through a channelizing mask one or more bombarding species for selectively bombarding said second material region of the substrate and thereby subtractively creating or exposing particles of the substrate that define nucleation-friendly sites.

24. A manufacture comprising:

(a) a substrate composed of a nucleation-unfriendly first material that is comparatively unfriendly to attachment thereto by particles of second and third materials, where said second and third materials can form respective single crystal materials which can differ from one another at least in one of crystal orientation and chemical composition;

(b) a first set of spaced-apart nucleation-friendly sites defined in the substrate such that the apart spacings of said first set correspond to whole number multiples of respective lattice constants of a single crystal formed from said second material, and thereby substantially define a first growth template for preferentially seeding growth of said single crystal of the second material, where each nucleation-friendly site in said first set is defined by one or more particles of a fourth material to which said particles of the second material attach more preferentially than to particles of said first, nucleation-unfriendly material; and (c) a second set of spaced-apart nucleation-friendly sites defined in the substrate such that the apart spacings of said second set correspond to whole number multiples of respective lattice constants of a single crystal formed from said third material, and thereby substantially define a second growth template for preferentially seeding growth of said single crystal of the third material, where each nucleation-friendly site in said first set is defined by one or more particles of a fifth material to which said particles of the third material attach more preferentially than to particles of said first, nucleation-unfriendly material;

wherein the respective single crystal materials which are respectively growable from said first and second sets of spaced-apart nucleation-friendly sites differ from one another at least in one of crystal orientation and chemical composition.

25. The manufacture of claim 24 and further comprising:
(d) a first single crystal grown from the first growth template; and
(e) a second single crystal grown from the second growth template.

26. The manufacture of claim 25 wherein:
(a.1) said substrate includes an amorphous region in which at least one of said first and second growth templates is defined.

27. The manufacture of claim 26 wherein:
(d.1) said first single crystal defines an electrically conductive semiconductor.

28. The manufacture of claim 27 wherein:
(d.2) said second single crystal defines an optical transmission medium.

29. The manufacture of claim 25 wherein:
(d.1) said first single crystal defines an electrically conductive semiconductor.

30. The manufacture of claim 29 wherein:
(d.2) said second single crystal defines an optical transmission medium.

31. The manufacture of claim 25 wherein:
(d.1) said first single crystal defines an electrical insulator.

* * * * *

UNITED STATES PATENT AND TRADEMARK OFFICE
CERTIFICATE OF CORRECTION

PATENT NO.  : 6,110,278
DATED       : August 29, 2000
INVENTOR(S) : Arjun N. Saxena It is certified that error appears in the above-identified patent and that said Letters Patent is hereby corrected as shown below:

Column 3,
Line 11, "Sio$_2$" should be --SiO$_2$--.

Column 11,
Line 57, "venergies" should be --energies--.

Column 14,
Lines 43 and 44, "rp" should be --r$_p$--;
Line 63, "+Δx" should be --+Δx$_1$--.

Column 15,
Line 21, "al" should be --a$_1$--.

Column 25,
Line 40, "methal" should be --metal--;
Line 50, between "Ar(-)" and "Sn(+)" insert Al (+), --.

Column 26,
Line 34, "rp" should be --r$_p$--.

Signed and Sealed this

Nineteenth Day of June, 2001

Attest:

NICHOLAS P. GODICI
*Attesting Officer*  *Acting Director of the United States Patent and Trademark Office*